(12) United States Patent
Sekihara et al.

(10) Patent No.: US 8,586,416 B2
(45) Date of Patent: Nov. 19, 2013

(54) METHOD OF MANUFACTURING SEMICONDUCTOR DEVICE

(75) Inventors: Masahiko Sekihara, Kanagawa (JP); Masaki Furukawa, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/476,093

(22) Filed: May 21, 2012

(65) Prior Publication Data

US 2012/0302009 A1  Nov. 29, 2012

(30) Foreign Application Priority Data

May 24, 2011 (JP) ................................ 2011-115592

(51) Int. Cl.
    *H01L 21/00* (2006.01)
(52) U.S. Cl.
    USPC ............................ 438/118; 438/612; 257/676
(58) Field of Classification Search
    USPC ................................. 438/118, 612; 257/676
    See application file for complete search history.

(56) References Cited

U.S. PATENT DOCUMENTS

| | | | | |
|---|---|---|---|---|
| 4,390,771 A | * | 6/1983 | Kurtz et al. | 219/56.22 |
| 5,295,619 A | * | 3/1994 | Takahashi et al. | 228/180.5 |
| 5,763,849 A | * | 6/1998 | Nakao | 219/56.21 |
| 5,783,866 A | * | 7/1998 | Lee et al. | 257/780 |

FOREIGN PATENT DOCUMENTS

| | | |
|---|---|---|
| JP | 60-244034 A | 12/1985 |
| JP | 2008-130825 A | 6/2008 |
| JP | 2009-105114 A | 5/2009 |

* cited by examiner

*Primary Examiner* — Jarrett Stark
*Assistant Examiner* — Nicholas Tobergte
(74) *Attorney, Agent, or Firm* — Mattingly & Malur, PC

(57) ABSTRACT

Provided is a technology of suppressing, in forming an initial ball by using an easily oxidizable conductive wire and pressing the initial ball onto a pad to form a press-bonded ball, an initial ball from having a shape defect, thereby reducing damage to the pad. To achieve this, a ball formation unit is equipped with a gas outlet portion for discharging an antioxidant gas and a discharging path through this gas outlet portion is placed in a direction different from a direction of introducing the antioxidant gas into a ball formation portion. Such a structure widens a region for discharging the antioxidant gas, making it possible to prevent a gas flow supplied from the side of one side surface of the ball formation portion from being reflected by the other side surface facing with the one side surface and thereby forming a turbulent flow.

17 Claims, 37 Drawing Sheets

METHOD OF MANUFACTURING SEMICONDUCTOR DEVICE

CROSS-REFERENCE TO RELATED APPLICATIONS

The disclosure of Japanese Patent Application No. 2011-115592 filed on May 24, 2011 including the specification, drawings and abstract is incorporated herein by reference in its entirety.

BACKGROUND

The present invention relates to a manufacturing technology of a semiconductor device, in particular, to a technology effective when applied to a step of forming an initial ball at the end portion of a conductive wire extending from the tip portion of a capillary and bonding this initial ball to a pad on a semiconductor chip.

Japanese Patent Laid-Open No. 2009-105114 (Patent Document 1) describes a technology of providing a plurality of gas jet nozzles around a capillary and forming an initial ball at the tip portion of the capillary while jetting an inert gas from these gas jet nozzles.

Japanese Patent Laid-Open No. Sho 60-244034 (Patent Document 2) describes a technology of placing the tip portion of a capillary at a penetration member provided in a cylindrical cover and forming an initial ball at the tip portion of this capillary while feeding an internal space of the penetration member with an inert gas from a gas suction hole associated with this penetration member.

Japanese Patent Laid-Open No. 2008-130825 (Patent Document 3) describes a technology of placing a tip portion of a capillary in a through-hole provided in a porous member and forming an initial ball at the tip portion of the capillary while feeding an inert gas from the porous member.

[Patent Document 1] Japanese Patent Laid-Open No. 2009-105114
[Patent Document 2] Japanese Patent Laid-Open No. Sho 60-244034
[Patent Document 3] Japanese Patent Laid-Open No. 2008-130825

SUMMARY

Semiconductor devices are each included of a semiconductor chip having a semiconductor element such as MOSFET (Metal Oxide Semiconductor Field Effect Transistor) and a multilayer wiring, and a package covering therewith this semiconductor chip. The package has the following functions: (1) a function of electrically coupling the semiconductor element formed on the semiconductor chip to an external circuit and (2) a function of protecting the semiconductor chip from the outside environment such as humidity and temperature and preventing the semiconductor chip from breakage due to oscillation or impact or from deterioration in characteristics. In addition, the package has the following functions: (3) a function of facilitating handling of the semiconductor chip and (4) a function of dissipating heat generated during operation of the semiconductor chip and allowing the resulting semiconductor element to exhibit its functions fully.

In the package, in order to achieve, for example, the function of electrically coupling a semiconductor element formed on a semiconductor chip to an external circuit, the semiconductor chip is mounted on a wiring board and a pad formed on the semiconductor chip and a terminal formed on the wiring board are coupled to each other with a conductive wire.

When the pad formed on the semiconductor chip and the terminal formed on the wiring board are coupled to each other with a conductive wire, an initial ball is formed at the tip portion of a capillary first. Then, the initial ball formed at the tip portion of the capillary is pressed onto the pad. More specifically, the initial ball is pressed onto the pad by making use of the load and ultrasonic oscillation of the capillary. This causes deformation of the initial ball and a press-bonded ball capable of ensuring a sufficient contact area with the pad is formed. For forming the initial ball at the tip portion of the capillary, first, the tip portion of the capillary is placed at a ball formation portion in a ball formation unit. Then, electricity is discharged between a torch electrode and a wire protruding from the tip portion of the capillary. This discharge generates heat and due to the heat thus generated, the tip portion of the wire is melted. The melted wire becomes spherical due to surface tension and thus, a spherical initial ball can be formed at the tip portion of the capillary.

Since the conductive wire is sometimes made of an easily oxidizable metal, however, the surface of the initial ball may be oxidized by the heat generated upon discharge. As a result, the initial ball thus formed does not have a truly spherical shape and may have a shape defect such as a shape with a protruding end. This means that when an easily oxidizable conductive wire is used as a wire, an initial ball is likely to have a shape defect due to oxidation of the surface of the initial ball.

When an easily oxidizable conductive wire is used, it is the common practice to form the initial ball in the atmosphere of an antioxidant gas such as an inert gas to suppress oxidation of the surface of the initial ball. Even if the initial ball is formed in the atmosphere of an antioxidant atmosphere, however, an insufficient concentration of the surrounding antioxidant gas atmosphere tends to form an initial ball having a shape defect. In addition, when the flow rate of the surrounding antioxidant gas becomes instable, the initial ball thus formed varies in diameter. Furthermore, when the antioxidant gas is not uniformly brought into contact with the conductive wire during formation of the initial ball, the initial ball thus formed is likely to have eccentricity relative to the conductive wire.

Such a shape defect of the initial ball easily gives damage to the pad of a semiconductor chip when the initial ball is pressed onto the pad to form a press-bonded ball.

An object of the invention is to provide a technology capable of, in forming an initial ball by using an easily oxidizable conductive wire and pressing this initial ball onto a pad to form a press-bonded ball, reducing damage to the pad by preventing formation of an initial ball having a shape defect.

The above-mentioned and the other objects and novel features of the present invention will be apparent from the description herein and accompanying drawings.

The typical inventions, among the inventions disclosed herein, will next be outlined.

A method of manufacturing a semiconductor device according to the typical embodiment is characterized by that in a ball formation unit having a ball formation portion, a gas inlet portion for introducing an antioxidant gas into the ball formation portion, and a gas outlet portion for discharging the antioxidant gas from the ball formation portion, a tip portion of a capillary is placed in the ball formation portion to form an initial ball and when the initial ball is formed, the gas outlet portion is provided in a direction different from the direction of introducing the antioxidant gas into the ball formation portion.

An advantage available from the typical invention, among the inventions disclosed herein, will next be descried briefly.

In a technology of forming an initial ball from a copper wire and pressing this initial ball onto a pad to by suppressing the initial ball from having a shape defect.

BRIEF DESCRIPTION OF THE DRAWINGS

FIGS. 35(a), 35(b), and 35(c) show the constitution of another ball formation unit in Modification Example 2, in which FIG. 35(a) is a plan view showing a portion of the another ball formation unit in Modification Example 2, FIG. 35(b) is a cross-sectional view taken along the line A-A in FIG. 35(a), and FIG. 35(c) is a cross-sectional view taken along the line B-B in FIG. 35(a);

FIGS. 36(a), 36(b), and 36(c) show the constitution of a further ball formation unit in Modification Example 2, in which FIG. 36(a) is a plan view showing a portion of the further ball formation unit in Modification Example 2, 36(b) is a cross-sectional view taken along the line A-A in FIG. 36(a), and FIG. 36(c) is a cross-sectional view taken along the line B-B in FIG. 36(a);

FIGS. 37(a), 37(b), and 37(c) show the constitution of a ball formation unit in Modification Example 3, in which FIG. 37(a) is a plan view showing a portion of the ball formation unit in Modification Example 3, FIG. 37(b) is a cross-sectional view taken along the line A-A in FIG. 37(a), and FIG. 37(c) is a cross-sectional view taken along the line B-B in FIG. 37(a);

FIGS. 38(a), 38(b), and 38(c) show the constitution of another ball formation unit in Modification Example 3, in which FIG. 38(a) is a plan view showing a portion of the another ball formation unit in Modification Example 3, FIG. 38(b) is a cross-sectional view taken along the line A-A in FIG. 38(a), and FIG. 38(c) is a cross-sectional view taken along the line B-B in FIG. 38(a);

FIGS. 39(a), 39(b), and 39(c) show the constitution of a ball formation unit of Second Embodiment, in which FIG. 39(a) is a plan view showing a portion of the ball formation unit in Second Embodiment, FIG. 39(b) is a cross-sectional view taken along the line A-A in FIG. 39(a), and FIG. 39(c) is a cross-sectional view taken along the line B-B in FIG. 39(a);

DETAILED DESCRIPTION

Figure 1:
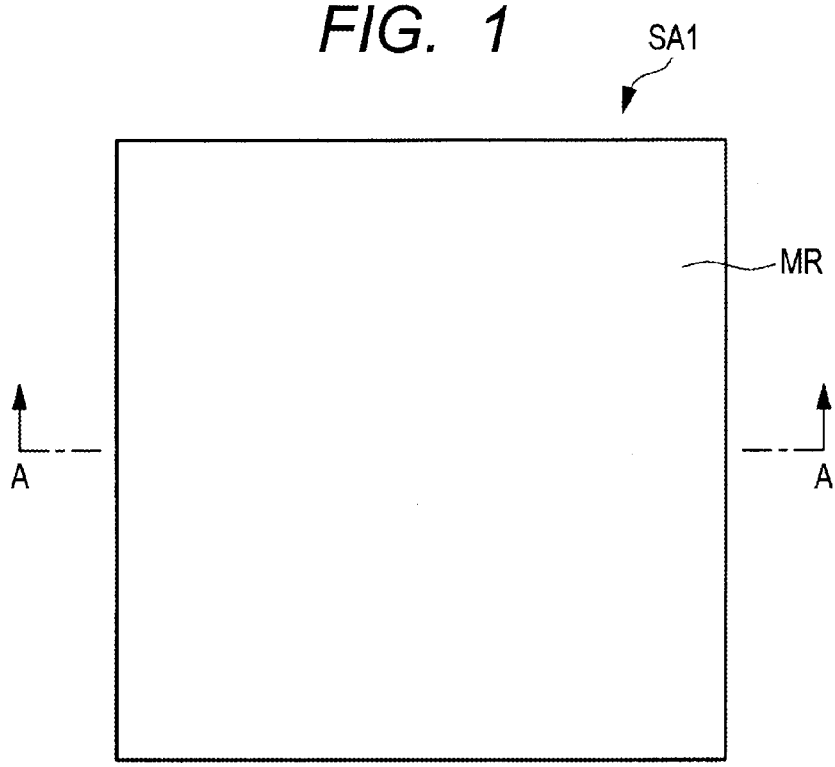
FIG. 1 is a plan view of a semiconductor device SA1 made of a BGA package viewed from above.

In the following embodiments, a description will be made after divided into a plurality of sections or embodiments if necessary for convenience sake. They are not independent from each other, but in a relation such that one is a modification example, details, a complementary description, or the like of a part or whole of the other one unless otherwise specifically indicated.

In the following embodiments, when a reference is made to the number of elements (including the number, value, amount, range, or the like), the number is not limited to a specific number but may be greater than or less than the specific number, unless otherwise specifically indicated or principally apparent that the number is limited to the specific number.

Further, in the following embodiments, it is needless to say that the constituting elements (including element steps or the like) are not always essential unless otherwise specifically indicated or principally apparent that they are essential.

Similarly, in the following embodiments, when a reference is made to the shape, positional relationship, or the like of the constituting elements, that substantially approximate or similar to it is also embraced unless otherwise specifically indicated or principally apparent that it is not. This also applies to the above-described value and range.

In all the drawings for describing the below-described embodiments, members of a like function will be identified by like reference numerals and overlapping descriptions will be omitted. Even a plan view may be hatched to facilitate understanding of the drawing.

(First Embodiment) <Constitution Example of Semiconductor Device (BGA Package)> There are various package structures for semiconductor devices, for example, BGA (Ball Grid Array) package and QFP (Quad Flat Package). The technical concept of the invention can be applied to these packages. The constitution example of a semiconductor device made of a BGA package and the constitution example of a semiconductor device made of a QFP will next be described.

First, the constitution example of a semiconductor device made of a BGA package is described referring to some drawings. FIG. 1 is a plan view of a semiconductor device SA1 made of a BGA package viewed from above. As shown in FIG. 1, the semiconductor device SA1 according to this embodiment has a rectangular shape and the semiconductor device SA1 has a top surface covered with a resin (sealing body) MR.

Figure 2:
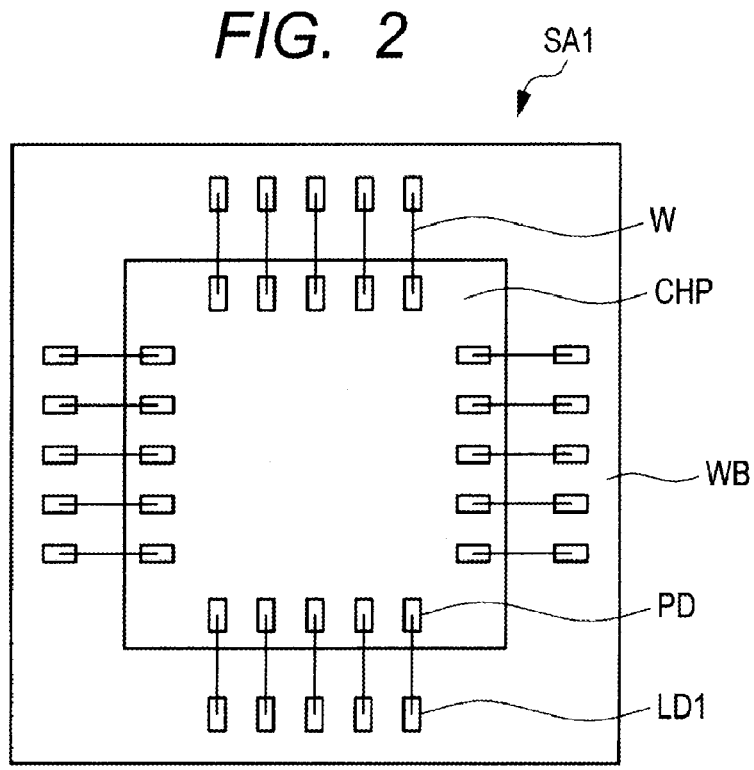
FIG. 2 is a diagram of the semiconductor device viewed from above and at the same time, viewed through a resin.

FIG. 2 is a diagram of the semiconductor device SA1 viewed from above and at the same time, viewed through the resin MR. As shown in FIG. 2, the semiconductor device SA1 has a wiring substrate WB having a rectangular shape when viewed through the resin MR. This wiring substrate WB has thereon a semiconductor chip CHP. This semiconductor chip CHP has also a rectangular shape. The semiconductor chip CHP is smaller in size than the wiring substrate WB and the semiconductor chip is placed so as to be enclosed in the wiring substrate WB when viewed planarly. In particular, the four sides of the semiconductor chip CHP are placed in parallel to the four sides of the wiring substrate WB, respectively.

The semiconductor chip CHP has an integrated circuit. More specifically, a plurality of semiconductor elements such as MOSFET is formed on the semiconductor substrate constituting the semiconductor chip CHP and wiring layers are formed over the semiconductor substrate via an interlayer insulating film, thus constituting multilayer wiring. The integrated circuit is formed by electrically coupling these wiring layers to MOSFETs formed on the semiconductor substrate. In short, the semiconductor chip CHP has a semiconductor substrate having a plurality of MOSFETs and, over this substrate, wiring layers constituting multilayer wiring. Thus, the semiconductor chip CHP has an integrated circuit included of a plurality of MOSFETs and multilayer wiring. To provide an interface between this integrated circuit and an external circuit, the semiconductor chip CHP has a pad PD. This pad PD is formed by exposing a portion of the uppermost wiring layer formed as the uppermost layer of the multilayer wiring.

As shown in FIG. 2, the semiconductor chip CHP has, on the main surface (surface, top surface) thereof, a plurality of pads PD. More specifically, the chip has a plurality of pads PD along the four sides of the semiconductor chip CHP having a rectangular shape. A plurality of land terminals LD1 is formed along each of the four sides of the wiring substrate WB so that the land terminals correspond to the pads PD formed on the semiconductor chip CHP. The pads PD formed on the semiconductor chip CHP are electrically coupled to the land terminals LD1 formed on the wiring substrate WB via conductive members. The conductive members in the present embodiment are each a wire W made of, for example, copper (Cu).

Figure 3:
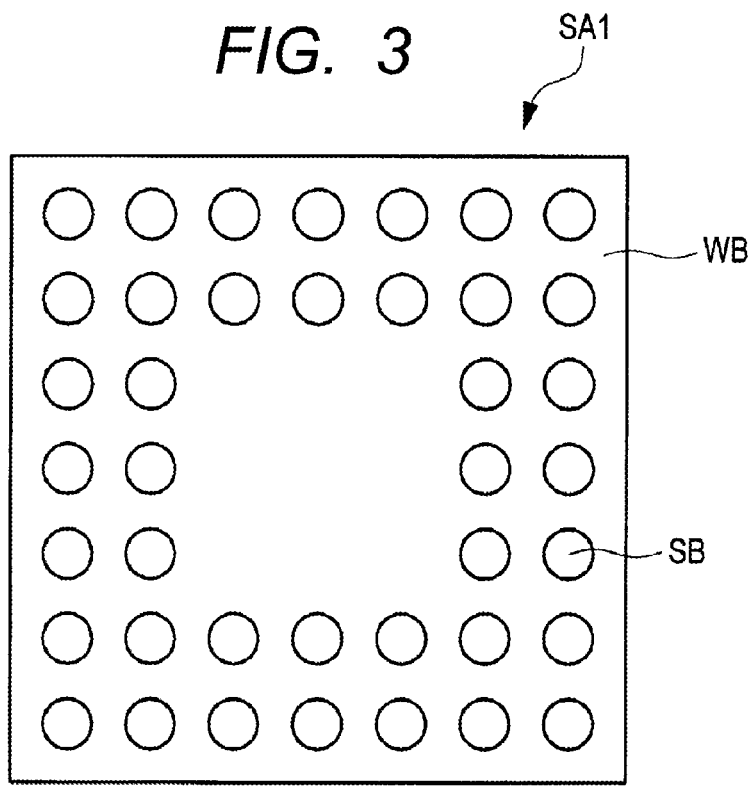
FIG. 3 is a diagram of the semiconductor device of the first embodiment viewed from the back surface of the device.

Next, FIG. 3 is a diagram of the semiconductor device SA1 of the first embodiment viewed from the back surface thereof. As shown in FIG. 3, the semiconductor device SA1 has, on the back surface thereof, a plurality of solder balls SB arranged in an array (in a line). These solder balls SB function as an external coupling terminal of the semiconductor device SA1.

Figure 4:
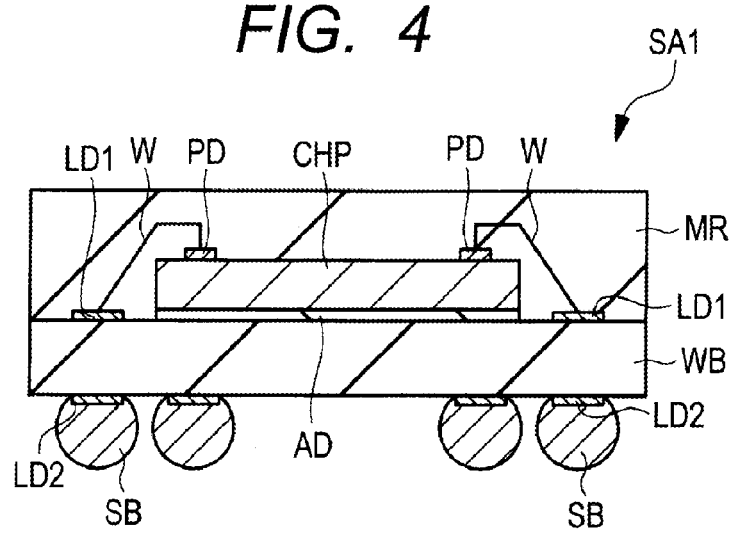
FIG. 4 is a cross-sectional view taken along the line A-A of FIG. 1.

FIG. 4 is a cross-sectional view taken along the line A-A of FIG. 1. In FIG. 4, the wiring substrate WB has, on the top surface thereof, the land terminals LD1 and, on the bottom surface of the wiring substrate WB, terminals (bump lands, electrodes) LD2. The wiring substrate WB has therein multilayer wiring and vias and the land terminals LD1 formed on the top surface of the wiring substrate WB are electrically coupled to the terminals LD2 formed on the bottom surface of the wiring substrate WB via multilayer wiring formed in the wiring substrate WB and via wirings formed inside the vias. The terminals LD2 formed on the bottom surface of the wiring substrate WB are arranged in an array form and solder balls SB are mounted on these terminals LD2. On the back surface (bottom surface) of the wiring substrate WB, solder balls SB coupled to the terminals LD2 are arranged in an array form.

The wiring substrate WB has, on the top surface (surface, main surface) thereof, the semiconductor chip CHP and this semiconductor chip CHP is bonded to the wiring substrate WB with an insulating adhesive AD. The pad PD formed on the main surface of the semiconductor chip CHP and the land terminal LD1 formed on the top surface of the wiring substrate WB are coupled to each other with the wire W. Further, the wiring substrate WB has, on the top surface thereof, a resin (sealing body) MR which has been formed so as to cover therewith the semiconductor chip CHP and the wire W.

In the semiconductor device SA1 having such a constitution, the pad PD formed on the semiconductor chip CHP is coupled to the land terminal LD1 formed on the wiring substrate WB with the wire W and the land terminal LD1 is electrically coupled to the terminal LD2 formed on the back surface of the wiring substrate WB with the wiring formed inside of the wiring substrate WB and the via wiring. This suggests that the integrated circuit formed in the semiconductor chip CHP is finally coupled to the solder ball SB after passing through a route of the pad PD→the wire W→the land terminal LD1→the terminal LD2→the solder ball SB, which further suggests that electrical coupling of the solder ball SB formed in the semiconductor device SA1 to an external circuit enables coupling of the integrated circuit formed in the semiconductor chip CHP to the external circuit.

Figure 5:
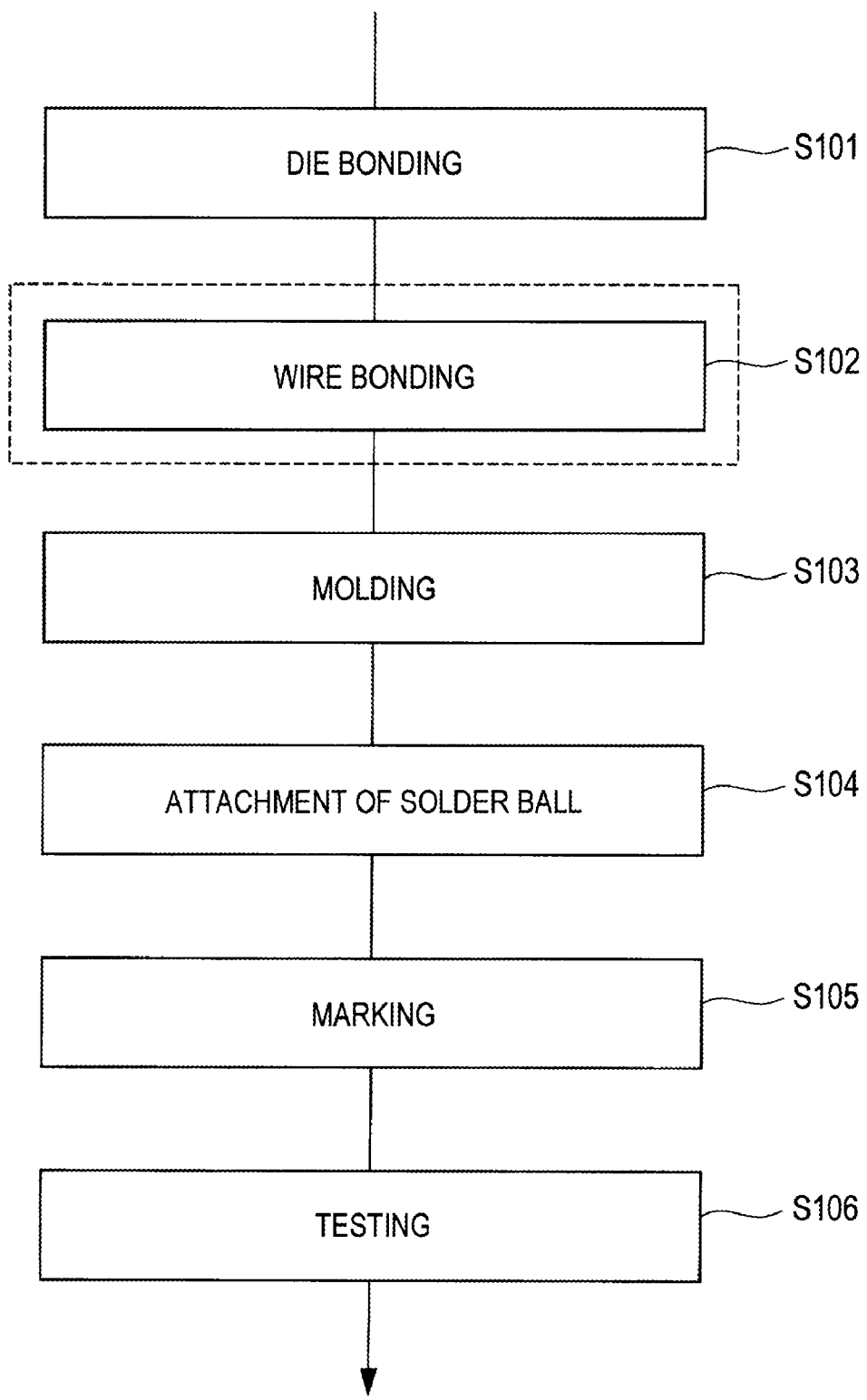
FIG. 5 is a flow chart showing the flow of manufacturing steps of a semiconductor device made of a BGA package.

<Manufacturing Method of Semiconductor Device (BGA Package)> The semiconductor device SA1 made of a BGA package has the constitution as described above. A method of manufacturing the device will next be described briefly. FIG. 5 is a flow chart showing the flow of manufacturing steps of the semiconductor device SA1 made of a BGA package.

First, a semiconductor element (MOSFET), multilayer wiring, and a pad are formed on each of chip regions of a semiconductor substrate (semiconductor wafer). After thinning the semiconductor substrate by carrying out back-surface grinding of the semiconductor substrate, the chip regions of the semiconductor substrate are diced into a plurality of semiconductor chips.

Next, a wiring substrate having a plurality of land terminals on the surface thereof and a plurality of terminals on the back surface on the side opposite to the surface is prepared. Then, an adhesive material is applied to a chip mounting portion (chip mounting region) present on the surface of the wiring substrate. With the adhesive material applied to the chip mounting portion of the wiring substrate, the semiconductor chip is mounted (die bonding step) (S101).

Then, the pad formed on the semiconductor chip and the land terminal formed on the wiring substrate are coupled to each other with a wire (wire bonding step) (S102). More specifically, first bonding is performed by pressing a capillary against the pad formed on the semiconductor chip. Then, the capillary is transferred and second bonding of the wire to the land terminal formed on the wiring substrate is performed. In this manner, the pad formed on the semiconductor chip and the land terminal formed on the wiring substrate are coupled to each other.

Next, a sealing body made of, for example, a resin is formed to cover the surfaces of the semiconductor chip, the wire, and the wiring substrate with the sealing body (molding step) (S103). Then, for example, a solder ball (external coupling terminal) made of a solder is attached to the terminal formed on the back surface of the wiring substrate (S104). The surface of the sealing body is then marked with a mark including a serial number by using, for example, laser (marking step) (S105). Testing (testing step) (S106) of the semiconductor device SA1 thus manufactured is then performed in the end, whereby products are classified into a group of non-defective products and a group of defective products. The semiconductor device SA1 judged as a non-defective product is shipped.

The semiconductor device SA1 described above is made of a BGA package, but the technical concept of the invention can also be applied to a device made of another package. For example, it can also be applied to a package type using not a wiring substrate but a lead frame as a base material (wiring board) on which a semiconductor chip is to be mounted. More specifically, the technical concept of the invention can be applied widely to devices made of a QFP package or QFN package. In particular, the constitution example of a semiconductor device made of a QFP package will next be described.

Figure 6:
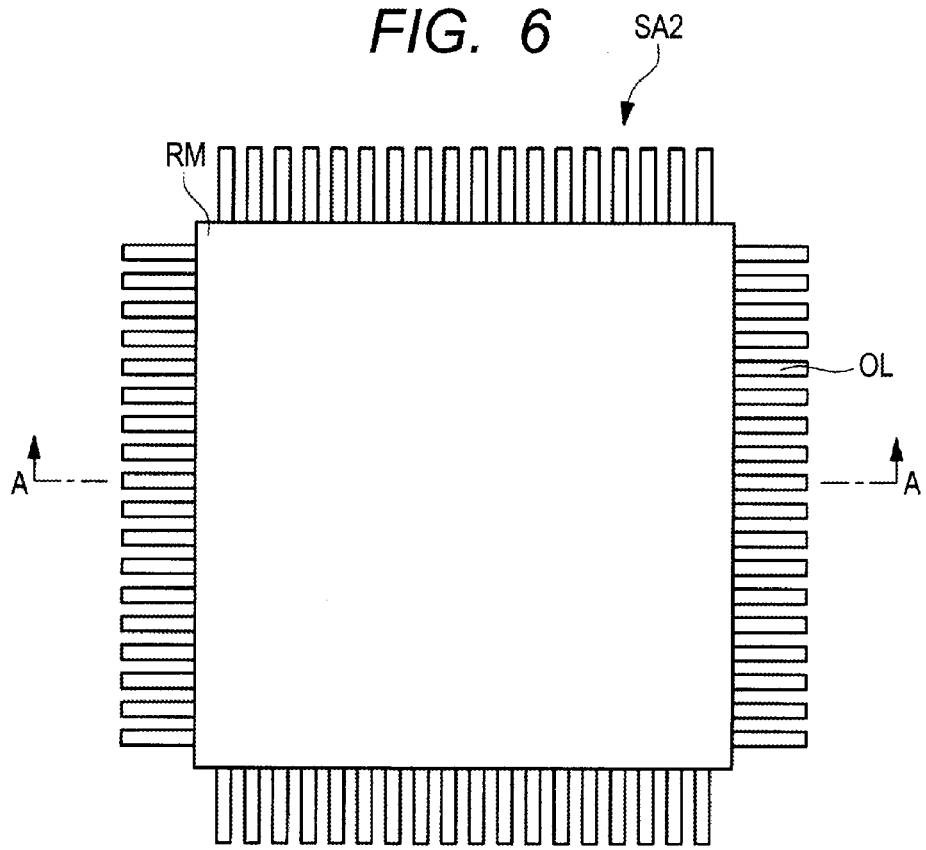
FIG. 6 is a plan view of a semiconductor device made of a QFP package viewed from above.

<Constitution Example of Semiconductor Device (QFP Package)> First, the constitution of a semiconductor device made of a QFP package is described referring to some drawings. FIG. 6 is a plan view of a semiconductor device SA2 made of a QFP package viewed from above. As shown in FIG. 6, the semiconductor device SA2 has a rectangular shape and the semiconductor device SA2 is covered, at the upper surface thereof, with a resin (sealing body) RM. Outer leads OL protrude outside from the four sides defining the contour of the resin RM.

Figure 7:
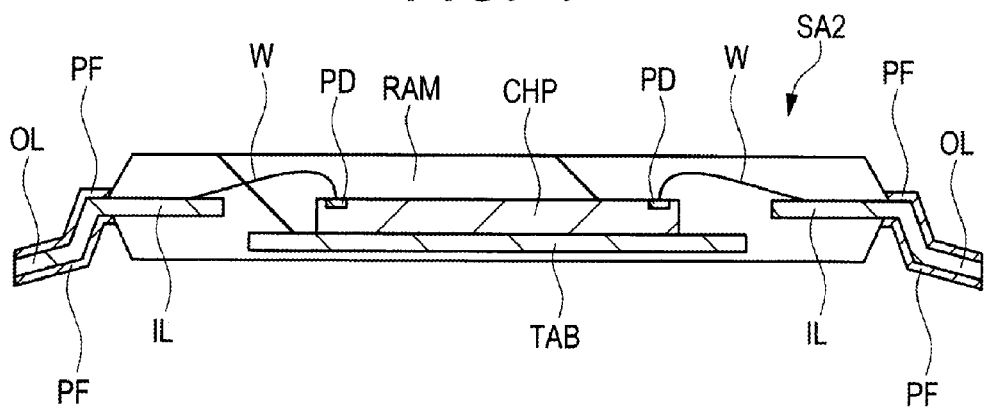
FIG. 7 is a cross-sectional view taken along the line A-A of FIG. 6.

Next, the internal structure of the semiconductor device SA2 will be described. FIG. 7 is a cross-sectional view taken along the line A-A of FIG. 6. As shown in FIG. 7, the back surface of a chip mounting portion TAB is covered with a resin RM. On the other hand, the chip mounting portion TAB has, on the top surface thereof, a semiconductor chip CHP and the semiconductor chip CHP has, in the main surface thereof, a pad PD. The pad formed in the semiconductor chip CHP is electrically coupled to an inner lead IL with a wire W. The semiconductor chip CHP, the wire W, and the inner lead IL are covered with the resin RM and an outer lead OL integrated with the inner lead IL protrudes from the resin RM. The outer lead OL protruding from the resin RM has a gull wing form and has, on the surface of the outer lead, a metallic deposit PF.

The chip mounting portion TAB, the inner lead IL, and the outer lead OL are made of, for example, a copper material or 42 alloy which is an alloy between iron and nickel, while the wire W is made of, for example, a copper wire. The semiconductor chip CHP is made of, for example, silicon or a compound semiconductor (such as GaAs) and this semiconductor chip CHP has a plurality of semiconductor elements. The semiconductor element has, in the upper portion thereof, many wiring layers via an interlayer insulating film. In the uppermost layer of these wiring layers, a pad PD to be coupled thereto is formed. Accordingly, the semiconductor element formed in the semiconductor chip CHP is electrically coupled to the pad PD via the multilayer wiring. In other words, the semiconductor element formed on the semiconductor chip XHP and multilayer wiring constitute an integrated circuit and the pad PD functions as a terminal for coupling this integrated circuit to the outside of the semiconductor chip CHP. This pad PD is coupled to the inner lead IL with the wire W and is coupled to the outer lead OL integrated with the inner lead IL. This suggests that the integrated circuit formed in the semiconductor chip CHP can be electrically coupled to the outside of the semiconductor device SA2 through the following route: pad PD→wire W→inner lead IL→outer lead OL→external coupling apparatus. In short, this suggests that the integrated circuit formed in the semiconductor chip CHP can be controlled by inputting an electrical signal from the outer lead OL formed in the semiconductor device SA2. It also suggests that an output signal from the integrated circuit can be taken outside from the outer lead OL.

Figure 8:
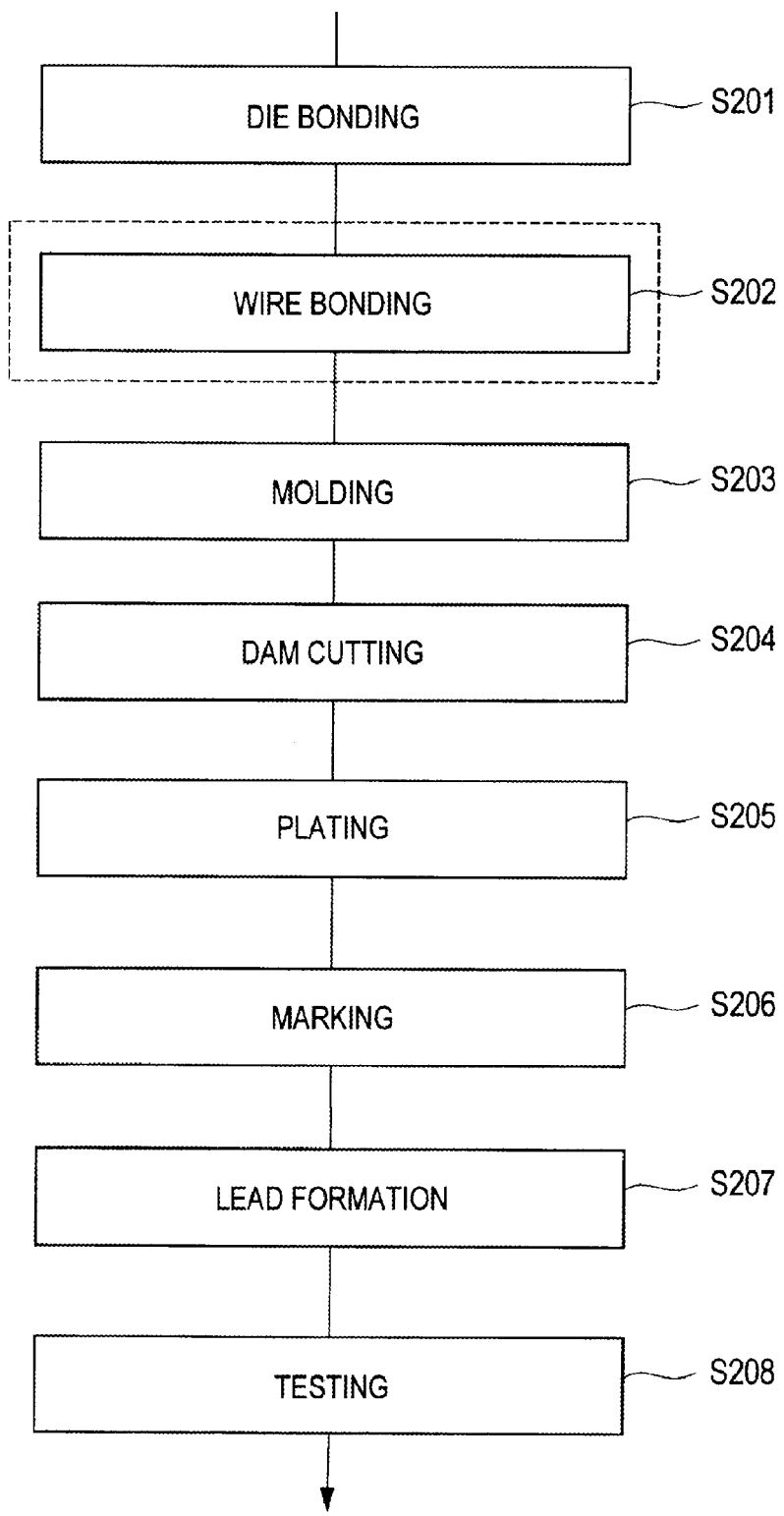
FIG. 8 is a flow chart showing the flow of manufacturing steps of a semiconductor device made of a QFP package after formation of an integrated circuit on a semiconductor chip.

<Manufacturing Method of Semiconductor Device (QFP Package)> The semiconductor device SA2 made of a QFP package has the constitution as described above. A manufacturing method of the device will hereinafter be described briefly. FIG. 8 is a flow chart showing the flow of manufacturing steps of a semiconductor device made of a QFP package after formation of an integrated circuit in a semiconductor chip. First, after mounting of a semiconductor chip on a chip mounting portion formed on a lead frame (die bonding step of S201), a pad formed in the semiconductor chip is coupled to an inner lead with a wire (wire bonding step of S202). Then, the chip mounting portion, the semiconductor chip, and the inner lead are sealed with a resin (molding step of S203). After a dam formed on the leadframe is cut (dam cutting step of S204), a metal is deposited by plating on the surface of the outer lead exposed from the resin (plating step of S205). After marking the surface of the resin (marking step of S206), an outer lead protruding from the resin is molded (lead molding step of S207). After formation of the semiconductor device SA2 in such a manner, an electric characteristic test is performed (testing step of S208) and the semiconductor device SA2 judged as a non-defective product is shipped as a product.

Figure 9A:
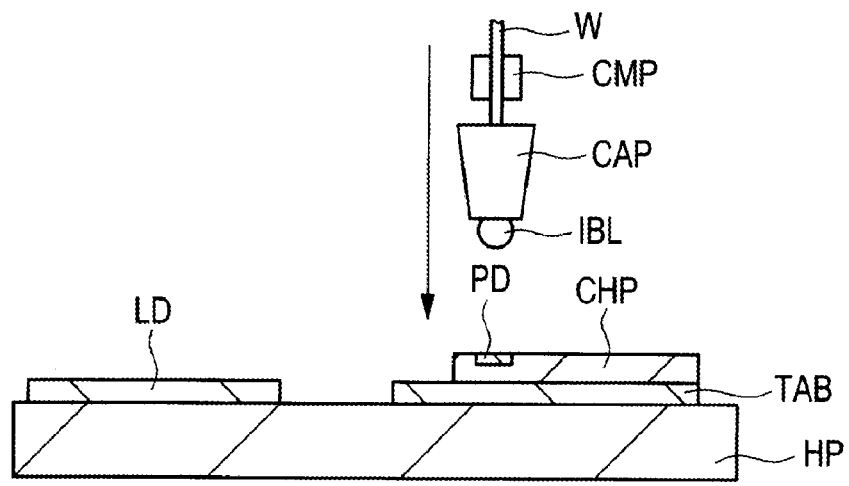
FIG. 9($a$) is a partial cross-sectional view showing the operating manner of a capillary in a wire bonding step and FIG. 9($b$) is a plan view showing the operating manner of the capillary.
Figure 9B:
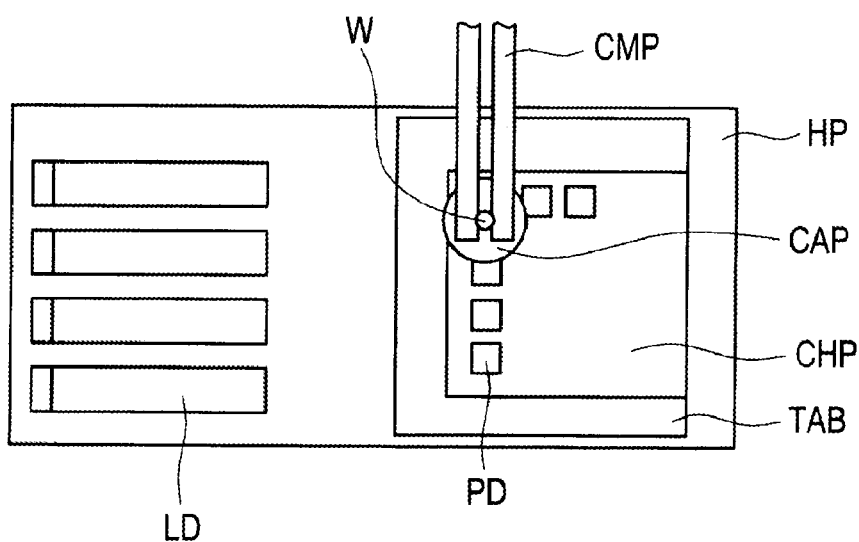

<Details of Wiring Bonding Step> As described above, the semiconductor device SA1 made of a BGA package and the semiconductor device SA2 made of a QFP package are mentioned as examples of the package structure of a semiconductor device. The technical concept of the invention is common to both wire bonding steps (S102 of FIG. 5 and S202 of FIG. 8). Details of the wire bonding step will next be described with the QFP using a leadframe as an example. FIG. 9(a) to FIG. 14(a) are partial cross-sectional views showing the operating manner of a capillary in the wire bonding step; FIG. 9(b) to FIG. 14(b) are plan views of the operating manner of the capillary viewed from above. As shown in FIGS. 9(a) and 9(b), a lead LD and a chip mounting portion TAB which constitute a leadframe is placed on the heat plate HP. This semiconductor chip CHP has, in the surface (top surface) thereof, a pad PD. The heat plate HP functions as a heat source and it heats the lead LD placed on the heat plate HP and at the same time, heats the semiconductor chip CHP placed on the heat plate HP via the chip mounting portion TAB.

In the wire bonding step, as shown in FIGS. 9(a) and 9(b), a capillary CAP having at the tip portion thereof an initial ball IBL is lowered. More specifically, the capillary CAP is lowered onto the pad PD of the semiconductor chip CHP while fixing the wire W with a clamper CMP.

Figure 10A:
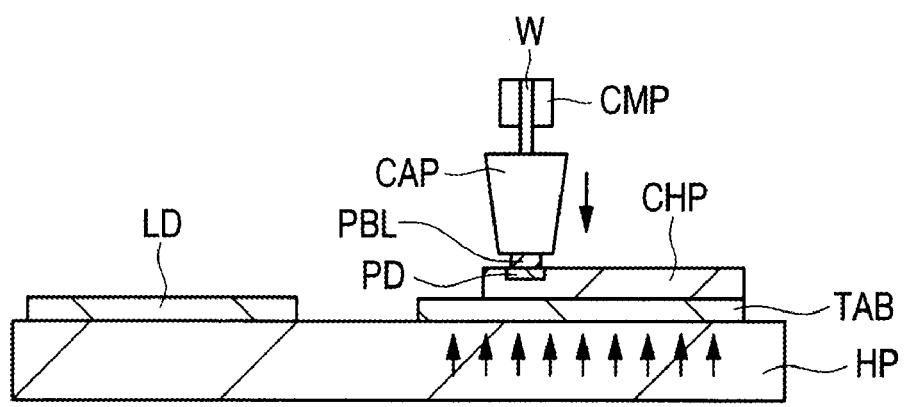
FIGS. 10($a$) and 10($b$) are diagrams following FIG. 9 for describing the wire bonding step, in which FIG. 10($a$) is a partial cross-sectional view showing the operating manner of the capillary and FIG. 10($b$) is a plan view showing the operating manner of the capillary.
Figure 10B:
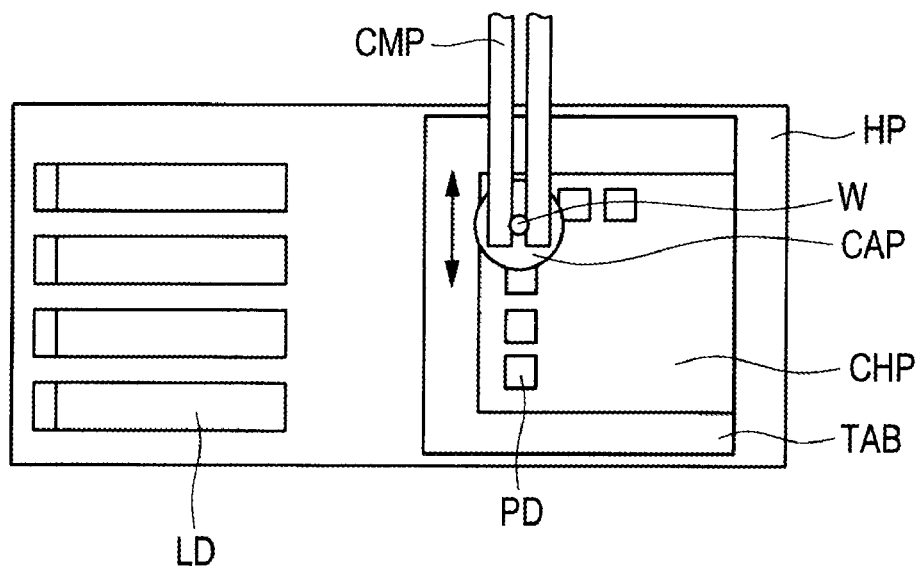

Then, as shown in FIGS. 10(a) and 10(b), after the initial ball IBL formed at the tip portion of the capillary CAP is landed onto the pad PD of the semiconductor chip CHP, the load of the capillary CAP, heat transferred from the heat plate HP to the semiconductor chip CHP, and ultrasonic amplitude (ultrasonic oscillation) applied to the capillary are applied to the initial ball IBL. As a result, the initial ball IBL is deformed into a press-bonded ball PBL having a large contact area with the pad PD. Thus, first bonding for forming the press-bonded ball PBL on the pad of the semiconductor chip CHP is performed.

Figure 11A:
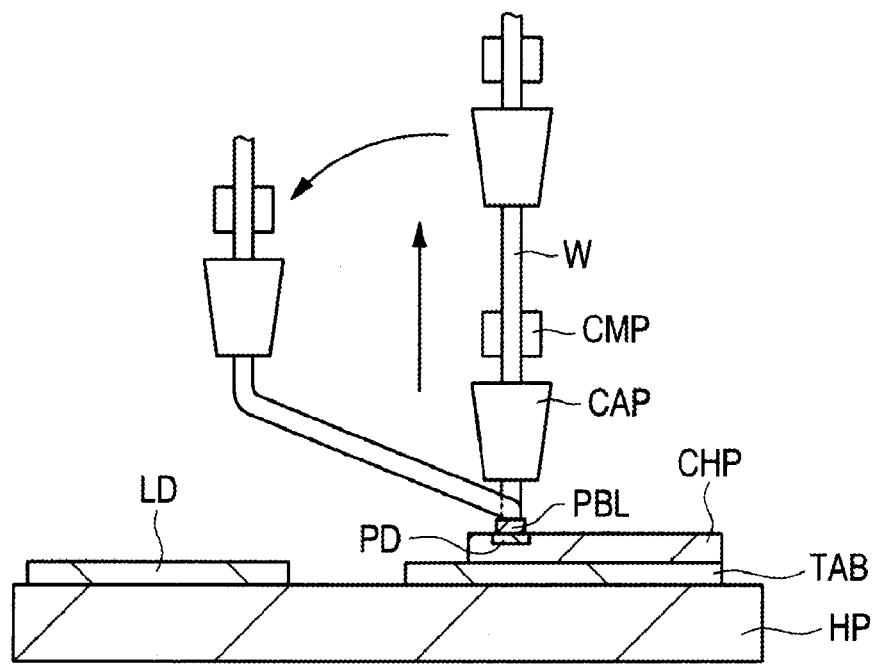
FIGS. 11($a$) and 11($b$) are diagrams following FIG. 10 for describing the wire bonding step, in which FIG. 11($a$) is a partial cross-sectional view showing the operating manner of the capillary and FIG. 11($b$) is a plan view showing the operating manner of the capillary.
Figure 11B:
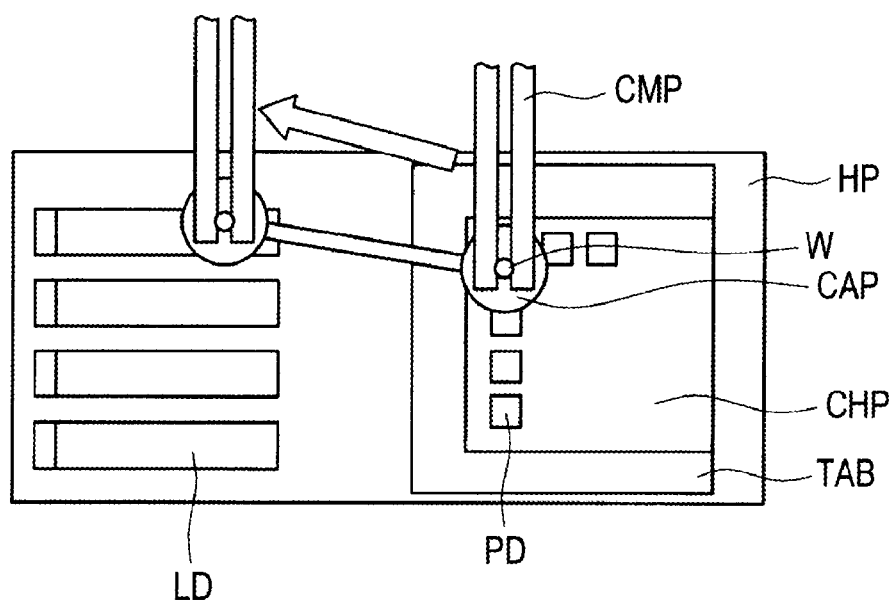
Figure 12A:
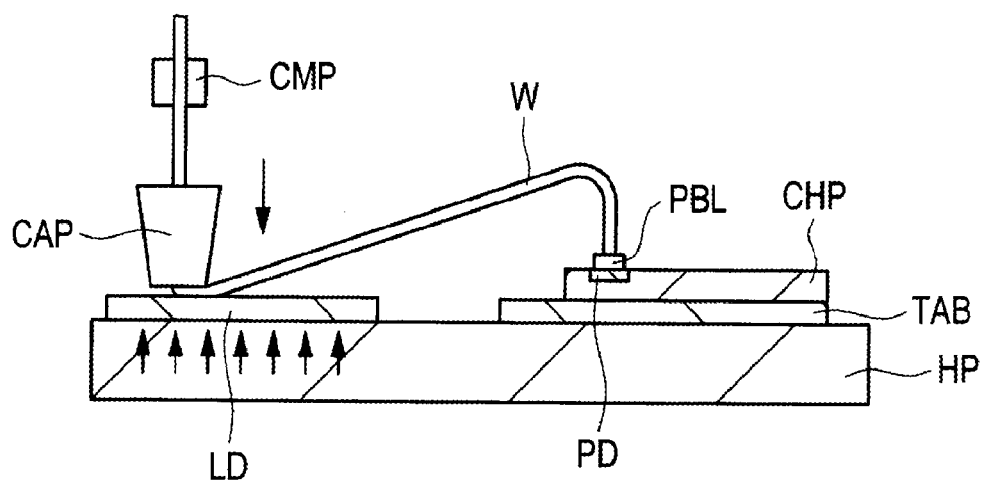
FIGS. 12($a$) and 12($b$) are diagrams following FIG. 11 for describing the wire bonding step, in which FIG. 12($a$) is a partial cross-sectional view showing the operating manner of the capillary and FIG. 12($b$) is a plan view showing the operating manner of the capillary.
Figure 12B:
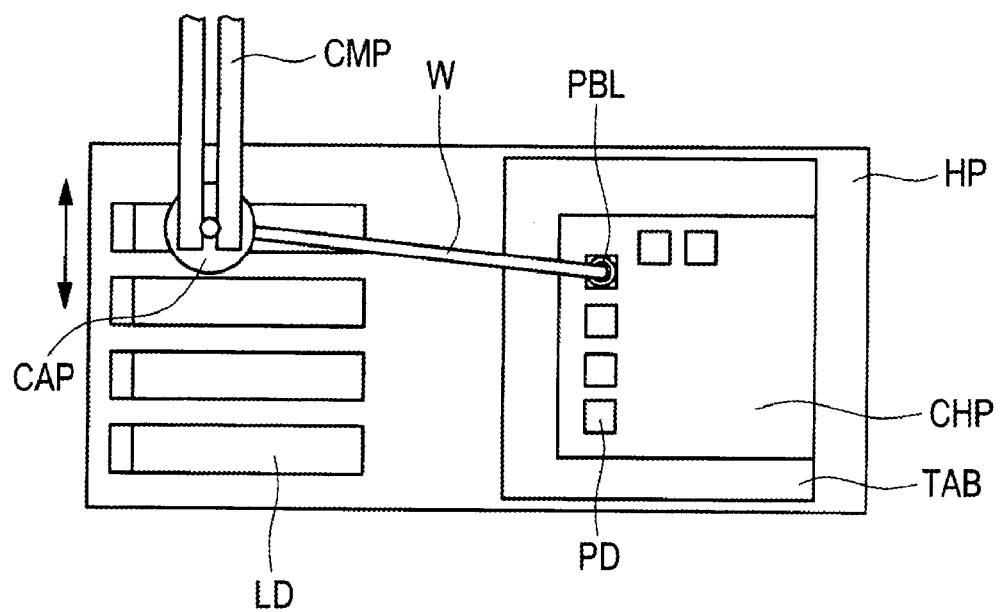

Next, as shown in FIG. 11(a) and FIG. 11(b), after the capillary CAP is lifted up while opening the clamper CMP and a wire necessary for forming a loop is extracted, the clamper CMP is closed and the capillary CAP is transferred onto the lead LD. Then, as shown in FIG. 12(a) and FIG. 12(b), the wire W delivered from the capillary CAP is bonded to the lead LD while applying thereto the load of the capillary CAP, heat transferred from the heat plate HP to the lead LD, and the ultrasonic amplitude (ultrasonic oscillation) applied to the capillary CAP. At the time of bonding, a stich portion (crescent portion) STCH is formed at a portion of the wire W coupled to the lead LD. In such a manner, second bonding for coupling the wire W to the lead LD is performed.

Figure 13A:
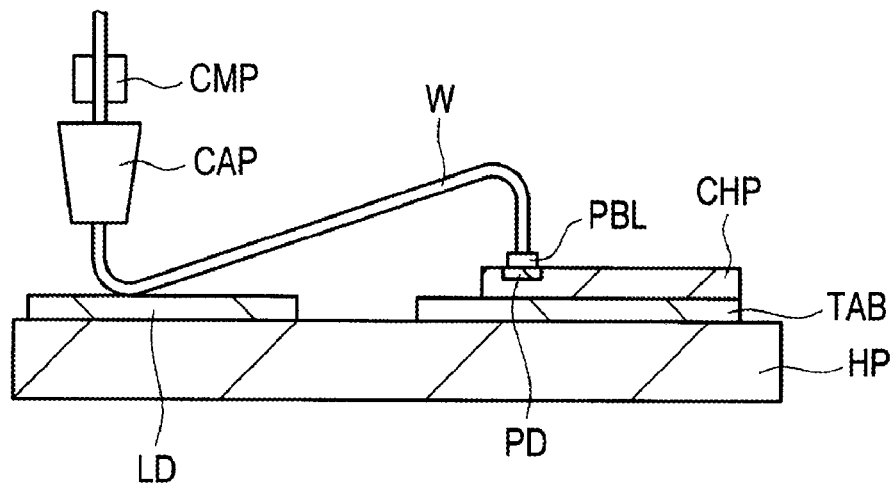
FIGS. 13($a$) and 13($b$) are diagrams following FIG. 12 for describing the wire bonding step, in which FIG. 13($a$) is a partial cross-sectional view showing the operating manner of the capillary and FIG. 13($b$) is a plan view showing the operating manner of the capillary.
Figure 13B:
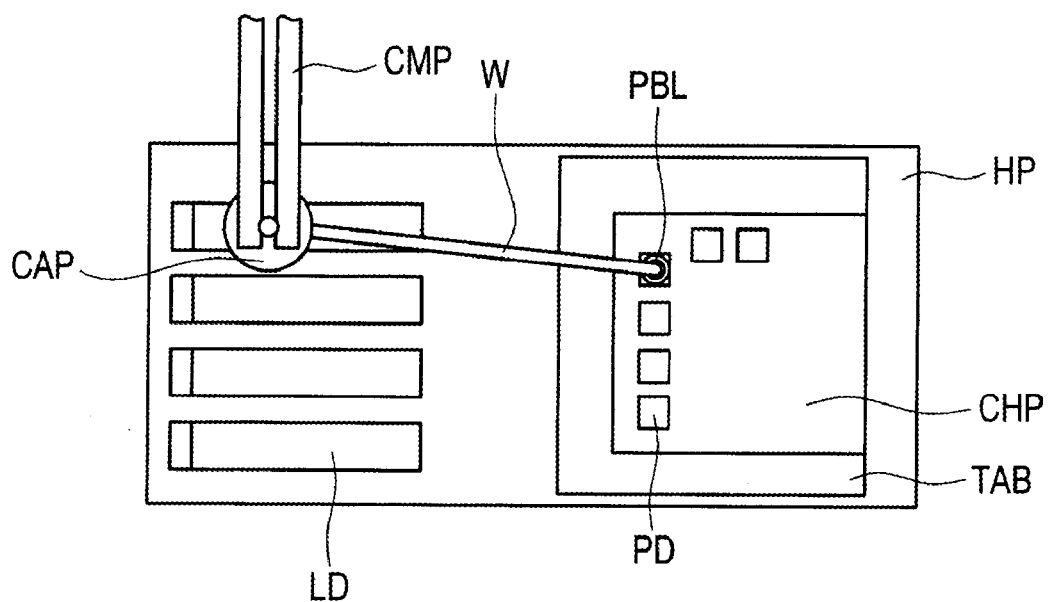
Figure 14A:
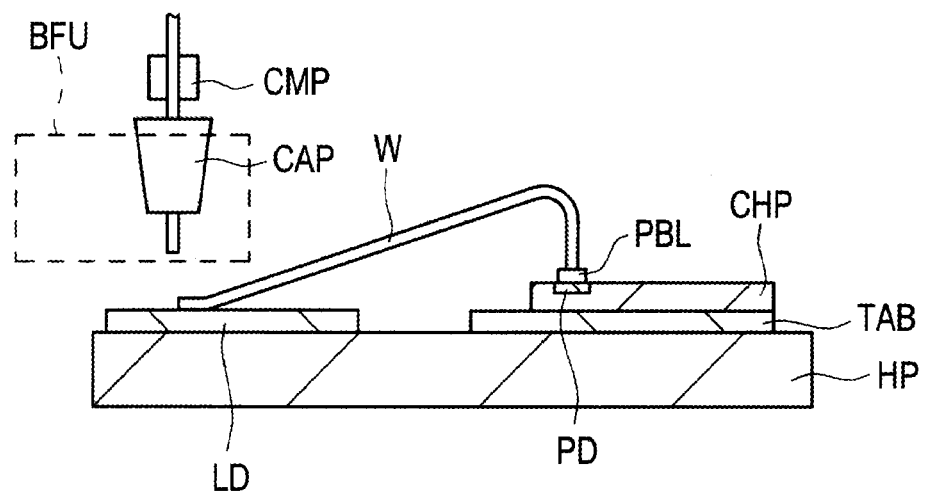
FIGS. 14($a$) and 14($b$) are diagrams following FIG. 13 for describing the wire bonding step, in which FIG. 14($a$) is a partial cross-sectional view showing the operating manner of the capillary and FIG. 14($b$) is a plan view showing the operating manner of the capillary.
Figure 14B:
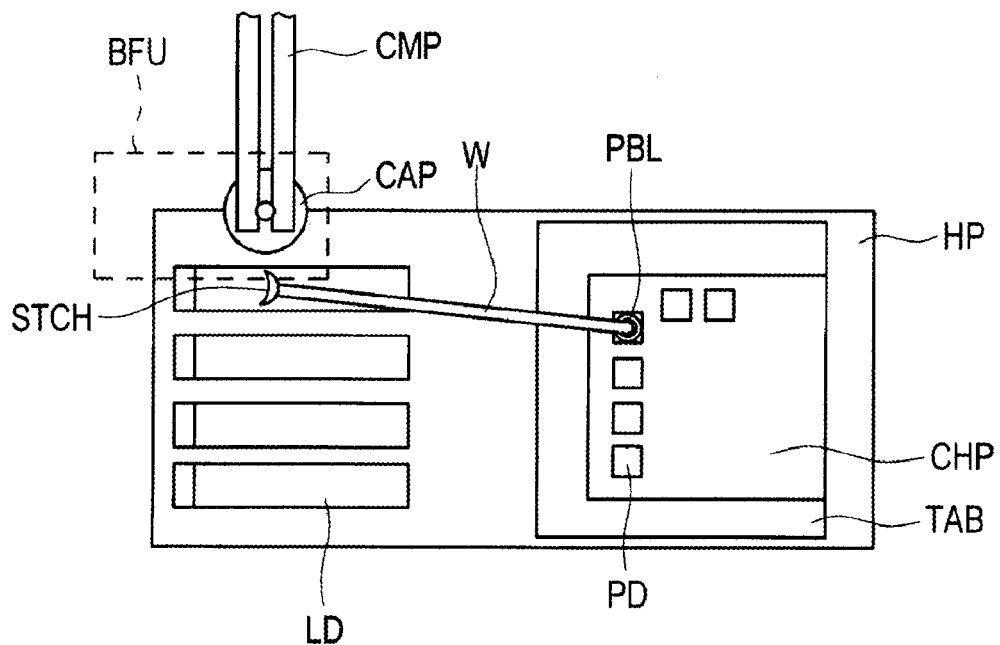

Then, as shown in FIG. 13(a) and FIG. 13(b), a wire W necessary for forming an initial ball is extracted by lifting up the capillary CAP while opening the clamper CMP. As shown in FIGS. 14(a) and 14(b), the wire W second-bonded to the lead LD is cut at the stitch portion STCH by lifting up the capillary CAP while closing the clamper CMP. Then, the capillary CAP is lifted up further to place the tip portion of the capillary CAP in the ball formation unit BFU.

Figure 15:
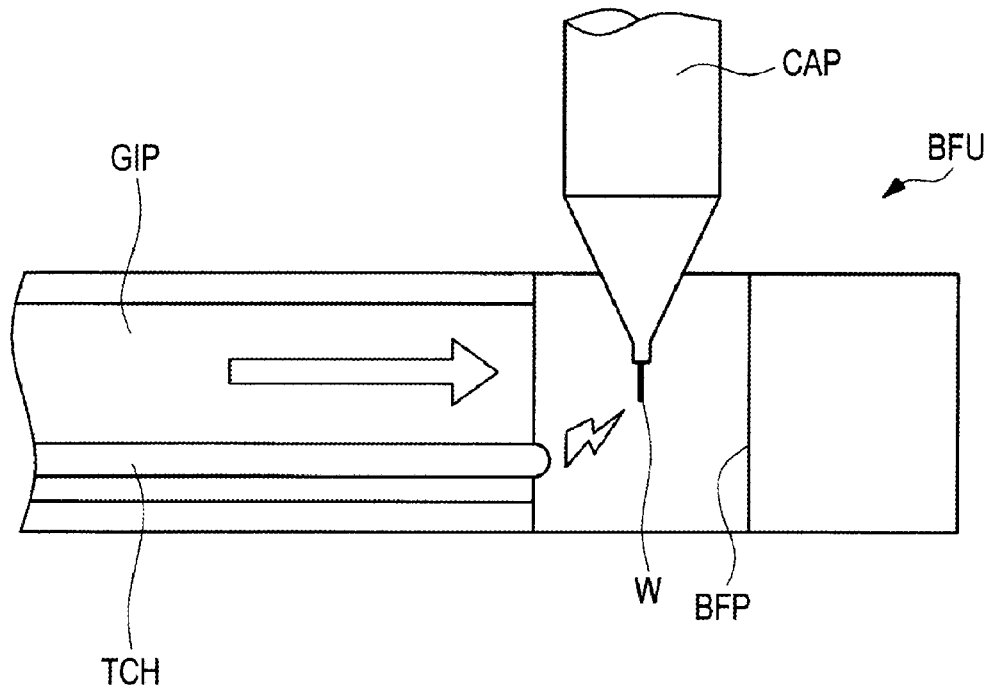
FIG. 15 is a diagram showing the placing manner of the tip portion of the capillary in a ball formation unit.

FIG. 15 shows the manner of placing the tip portion of the capillary CAP in the ball formation unit BFU. As shown in FIG. 15, the ball formation unit BFU is equipped with a ball formation portion BFP (ball formation part) BFP and a torch electrode TCH which is placed so as to protrude and be exposed from the inner wall of the ball formation portion BFP. The ball formation unit BFU is provided further with a gas inlet portion GIP for introducing an antioxidant gas into the ball formation portion BFP. Examples of the antioxidant gas introduced from the gas inlet portion GIP to the ball formation portion BFP include inert gases such as nitrogen gas and argon gas and a forming gas obtained by mixing a nitrogen gas which is an inert gas with a hydrogen gas which is a reducing gas.

Figure 16:
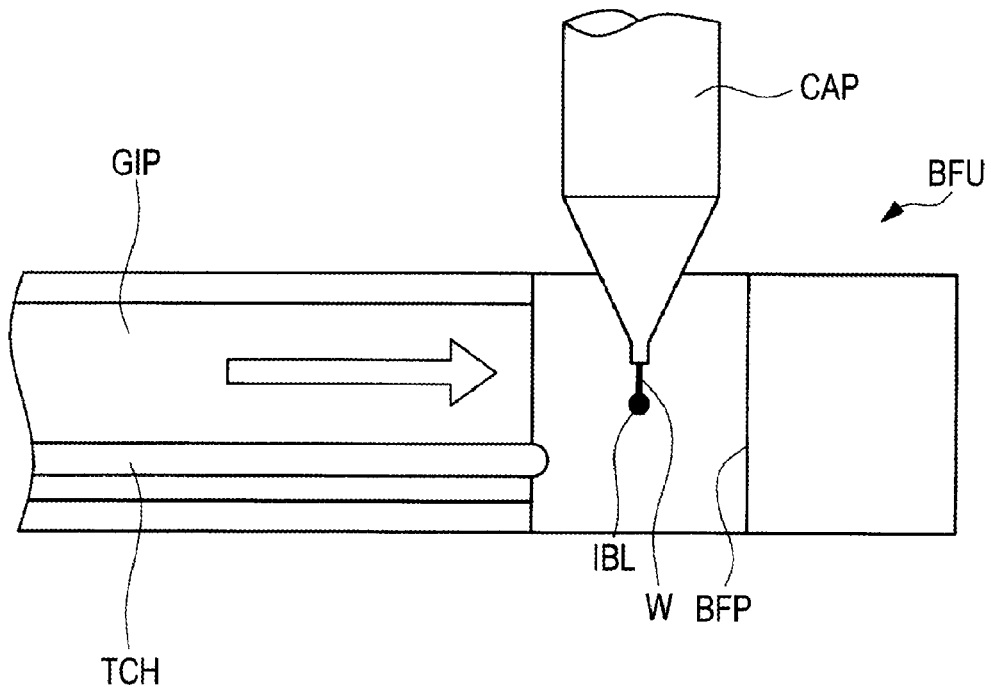
FIG. 16 is a diagram showing the formation manner of an initial ball at the tip portion of the capillary.

In the ball formation unit BFU having such a constitution, the ball formation portion BFP is formed to penetrate through the ball formation unit BFU in the thickness direction thereof to enable insertion of the capillary CAP in this ball formation portion BFP. As shown in FIG. 15, after the tip portion of the capillary CAP is placed inside the ball formation portion BFP, arc discharge is generated between the wire W extending from the tip portion of the capillary and the torch electrode TCH. This arc discharge generates heat, which melts the wire W extending from the tip portion of the capillary CAP. As shown in FIG. 16, the melted wire W becomes spherical due to the surface tension and thus, a spherical initial ball IBL can be formed at the tip portion of the capillary CAP. After formation of the initial ball IBL at the tip portion of the capillary CAP in such a manner, the above-described wire bonding step is repeated. This makes it possible to electrically couple plural pads PD formed in the semiconductor chip to plural leads LD with the wires W, respectively.

<Problems Found by Present Inventors> In the above-described wire bonding step, as shown in FIG. 15 or FIG. 16, the initial ball IBL is formed at the tip portion of the capillary CAP while introducing the antioxidant gas from the gas inlet portion GIP to the ball formation portion BFP. This initial ball formation method is employed because of the following reasons.

In general, gold has been used as a material of the wire W used in a wire bonding step. In this case, since gold is not oxidized so that it is less necessary to introduce an antioxidant gas in the ball formation portion BFP when the initial ball IBL is formed at the tip portion of the capillary CAP. A recent increase in the cost of gold however increases a proportion of the cost of a gold wire in that of semiconductor devices. To suppress this, using a copper wire made of copper lower in cost than gold is under investigation. In particular, a copper wire has, in addition to the lower cost, an advantage of a lower electrical resistivity than that of a gold wire. Thus, copper wires having such excellent electrical properties have attracted attentions.

When a wire is a copper wire, however, since copper is an easily oxidizable metal, heat generated as a result of arc discharge sometimes accelerates oxidation of the surface of the initial ball IBL. The initial ball IBL thus oxidized does not have a truly spherical shape but has a shape defect such as a shape with a protruding end with a high possibility. This means that when the wire used is an easily oxidizable copper wire, an initial ball IBL having a shape defect is likely to be formed as a result of oxidation of the surface of the initial ball IBL.

When an easily oxidizable wire such as copper is used as the wire W, the initial ball IBL is formed in the atmosphere of an antioxidant gas such as an inert gas in order to prevent oxidation of the surface of the initial ball IBL. In the above-described wire bonding step, as shown in FIG. 15 or FIG. 16, the initial ball IBL is formed at the tip portion of the capillary CP while introducing the antioxidant gas from the gas inlet portion GIP to the ball formation portion BFP. This means that the wire bonding step in the first embodiment is performed on the basis that an unoxidizable metal such as gold is not used as the wire W but an easily oxidizable metal such as copper or solder is used as the wire W. Thus, the technical concept of the first embodiment relates to a wire bonding step using an easily oxidizable metal as the wire W. This concept can be applied widely to the case where an easily oxidizable metal is used as the wire W. In particular, a description will next be made on the case of using a copper wire as an example.

Even if the initial ball IBL is formed in the atmosphere of an antioxidant gas as in the above-described wire bonding step, the initial ball IBL is likely to have a shape defect when the concentration of the antioxidant gas atmosphere around it is insufficient. In addition, when the flow rate of the antioxidant gas around it becomes instable upon formation of the initial ball IBL, there occur variations in the diameter of the initial ball IBL thus formed. Moreover, when the antioxidant gas is not brought into uniform contact with the copper wire, the initial ball IBL thus formed has an eccentricity relative to the copper wire with a high possibility. The present inventors have found that such a shape defect of the initial ball IBL tends to give damage to the pad PD when it is pressed onto the pad PD of the semiconductor chip CHP to form a press-bonded ball PBL. In particular, copper is harder than gold so that a greater load (for example, from about 1.5 to 2 times the load applied to gold) is often applied to deform the initial ball IBL into a press-bonded ball PBL. Formation of the initial ball IBL having a shape defect due to the copper wire used therefor becomes a cause of accelerating the damage to the pad with an increase in the load.

Figure 17:
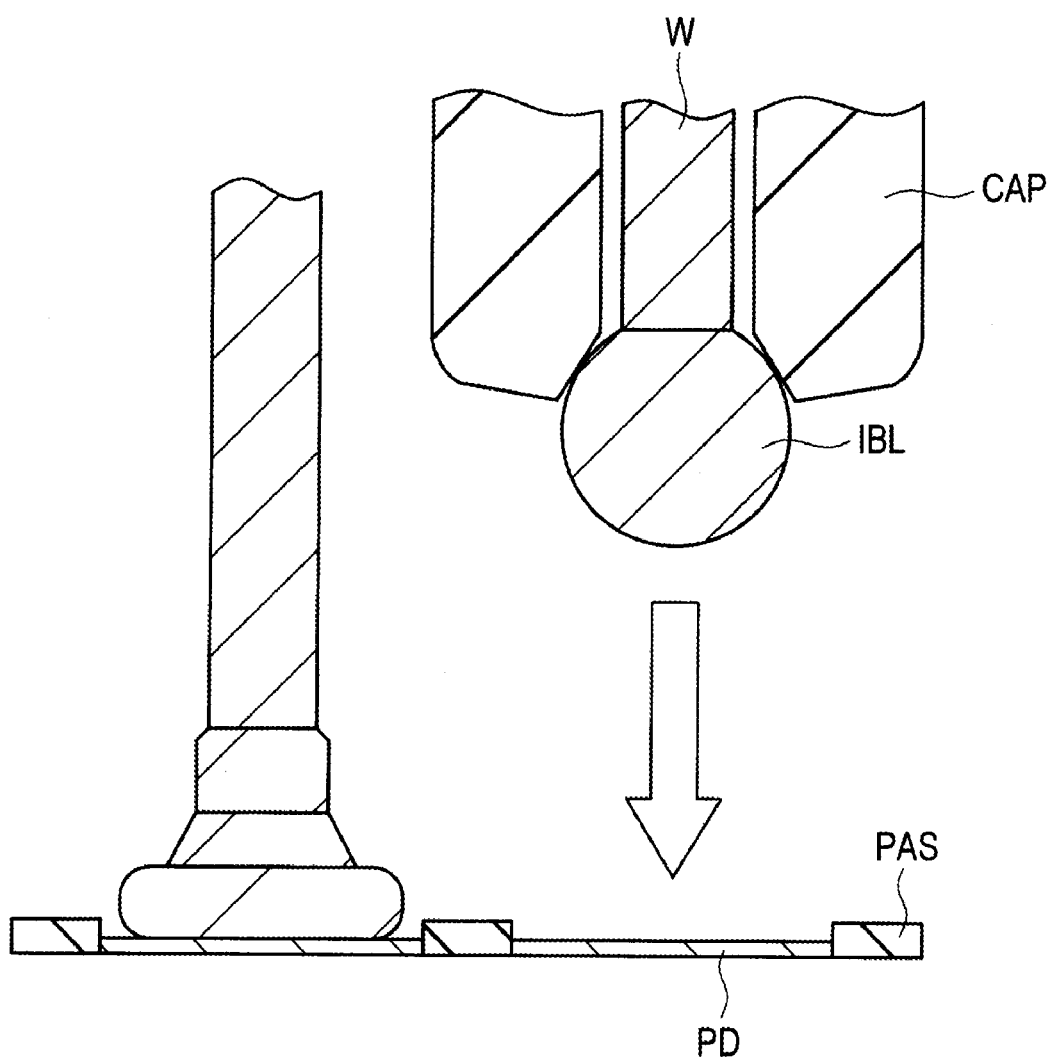
FIG. 17 is a cross-sectional view showing a first bonding step of a normal-shaped initial ball on a pad.
Figure 18:
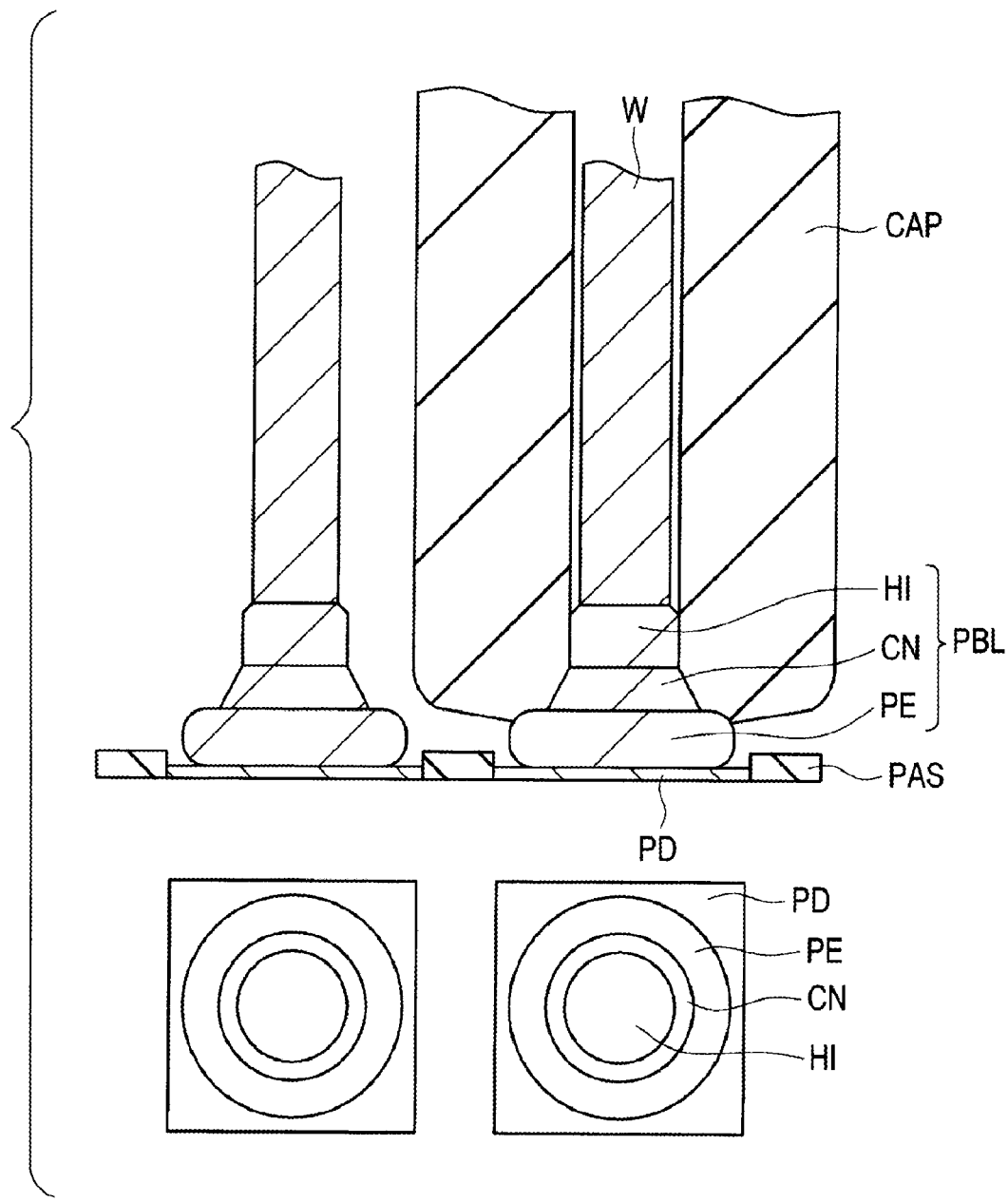
FIG. 18 is another cross-sectional view showing the first bonding step of the normal-shaped initial ball on the pad.

<Description on Damage to Pad Due to Initial Ball Having Shape Defect> With specific examples of the shape defect of the initial ball IBL, damage given to the pad PD will next be described in detail. The description is started from the case where the initial ball IBL has a normal shape. FIG. 17 and FIG. 18 are cross-sectional views showing a step of bonding (first bonding) an initial ball IBL having a normal shape onto a pad. As shown in FIG. 17, the pad formed in the semiconductor chip is exposed from the opening portion formed in a passivation film (surface protecting film) PAS. The capillary CAP is placed on this exposed pad PD. The capillary CAP has, at the tip portion thereof, an initial ball IBL. The initial ball IBL shown in FIG. 17 is in a normal state, more specifically, it is truly spherical, has an appropriate ball diameter, has no eccentricity, and has an unoxidized surface. The capillary CAP has, at the tip portion thereof, such an initial ball IBL and by lowering this capillary CAP, the initial ball IBL is landed on the pad PD. As shown in FIG. 18, the initial ball IBL landed on the pad PD is deformed into a press-bonded ball PBL by the load and ultrasonic oscillation from the capillary CAP and heat energy from a heat plate placed below the semiconductor chip. This press-bonded ball PBL is included of a pedestal portion PE, a cone portion formed on the pedestal portion PE, and a hole insertion portion HI formed on the cone portion CH. The initial ball IBL shown in FIG. 17 is in a normal state so that the press-bonded ball PBL having an appropriate shape is formed by the application of the load, ultrasonic oscillation, and heat load described above. This means that a press-bonded ball PBL can be formed on the pad PD without adding an unexpected damage to the pad PD present below the press-bonded ball PBL.

Figure 19:
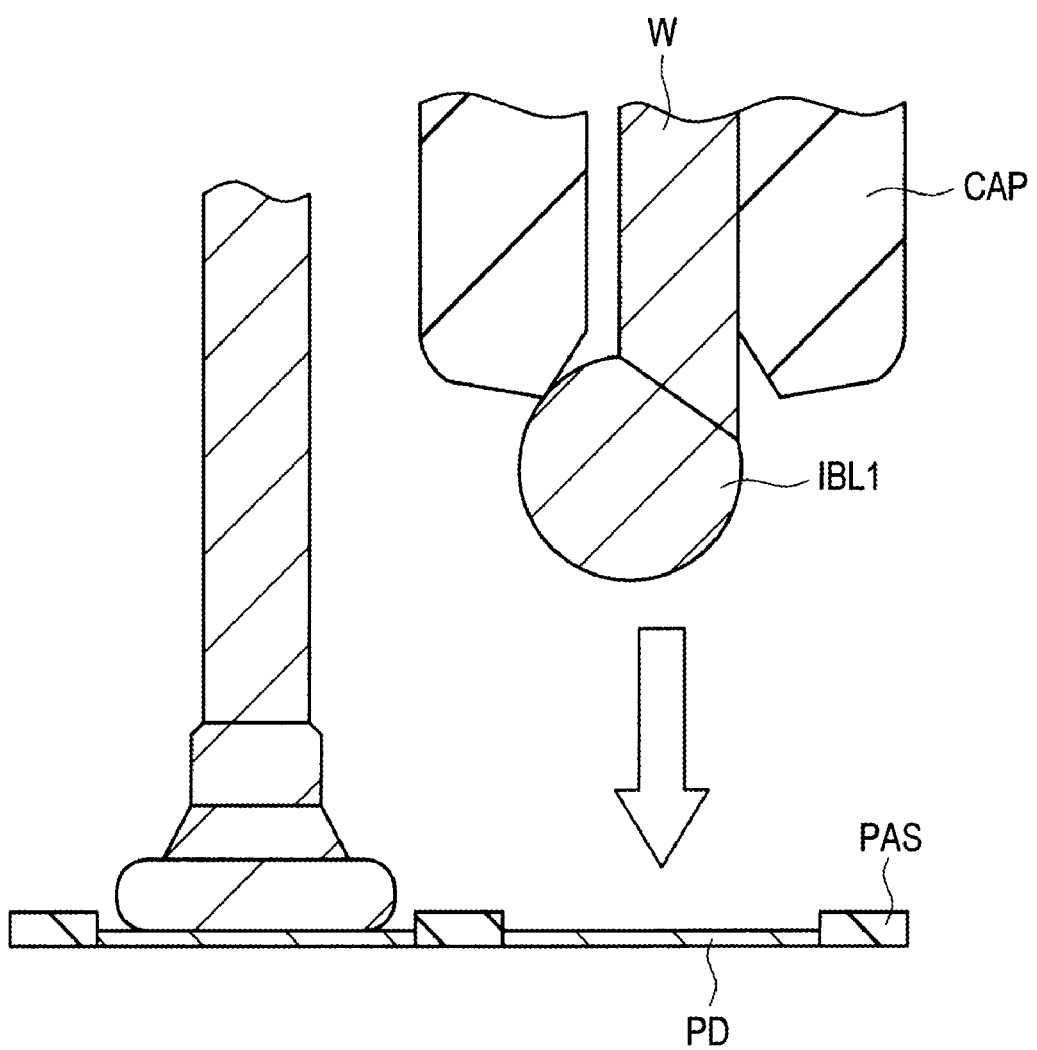
FIG. 19 is a cross-sectional view showing a first bonding step of an initial ball having an eccentricity relative to a wire onto the pad.
Figure 20:
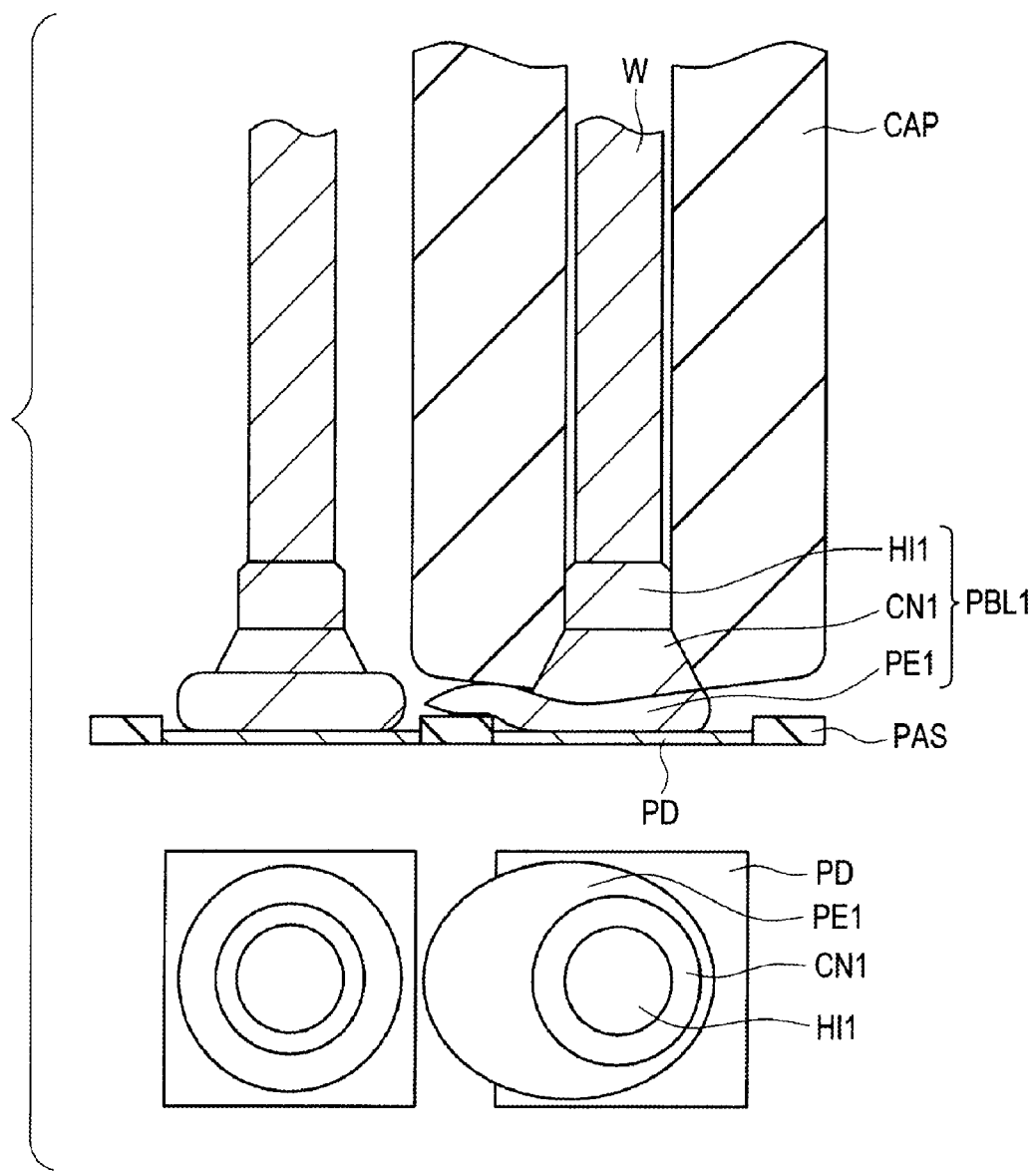
FIG. 20 is another cross-sectional view showing the first bonding step of the initial ball having an eccentricity relative to a wire onto the pad.

Next, a description will be made on an initial ball IBL1 in an abnormal state, that is, having an eccentricity relative to the wire W. FIG. 19 and FIG. 20 are cross-sectional views showing the first bonding step of the initial ball IBL1 having an eccentricity relative to the wire W onto the pad PD. As shown FIG. 19, the capillary CAP has, at a tip portion thereof, the initial ball IBL1 and the initial ball IBL1 shown in FIG. 19 has an eccentricity relative to the wire W and is therefore in an abnormal state. The capillary CAP has, at the tip portion thereof, such an initial ball IBL1 and by lowering this capillary CAP, the initial ball IBL1 is landed on the pad PD. As shown in FIG. 20, the initial ball IBL1 landed on the pad PD is deformed into a press-bonded ball PBL1 by the load and ultrasonic oscillation from the capillary CAP and the heat load from the heat plate placed below the semiconductor chip. This press-bonded ball PBL1 is included of a pedestal portion PE1, a cone portion CN1 formed on the pedestal portion PE1, and a hole insertion portion HI1 formed on the cone portion CN1. At this time, the load, ultrasonic oscillation, and heat load are applied to the initial ball IBL1 shown in FIG. 19. However, the initial ball IBL1 shown in FIG. 19 has an eccentricity relative to the wire W and is in an abnormal state so that the initial ball IBL1 is bonded onto the pad PD while deviating from the center of the capillary CAP. The pedestal portion PE1 of the press-bonded ball PBL1 is therefore mashed while deviating from the center. As a result, the pedestal portion PE1 has an irregular shape and damage is added partially to the pad with which the pedestal portion PE1 is in contact, reflecting this irregular shape of the pedestal portion PE1. Moreover, the initial ball IBL1 which has an eccentricity relative to the wire W and therefore is in an abnormal state is mashed unevenly so that the pedestal portion PE1 on the deviated side inevitably spreads out of the pad PD and hangs over the passivation film PAS. This means that the pedestal portion PE1 hangs over the passivation film PAS and a load is applied to the passivation film PAS. This load may cause cracks in the passivation film PAS. When cracks are generated in the passivation film PAS, water or foreign matters penetrate into the semiconductor chip through the cracks, which may damage the reliability of the semiconductor device. When the initial ball IBL shown in FIG. 19 has a severe eccentricity, uneven mashing of the initial ball IBL1 may bring the pedestal portion PE1 into contact even with the PBL1 adjacent thereto. Then, the press-bonded balls PBL1 adjacent to each other cause short-circuit, leading to malfunction of the semiconductor device. It has thus been elucidated that when the initial ball IBL1 has an eccentricity relative to the wire W, the resulting semiconductor device has reduced reliability.

Figure 21:
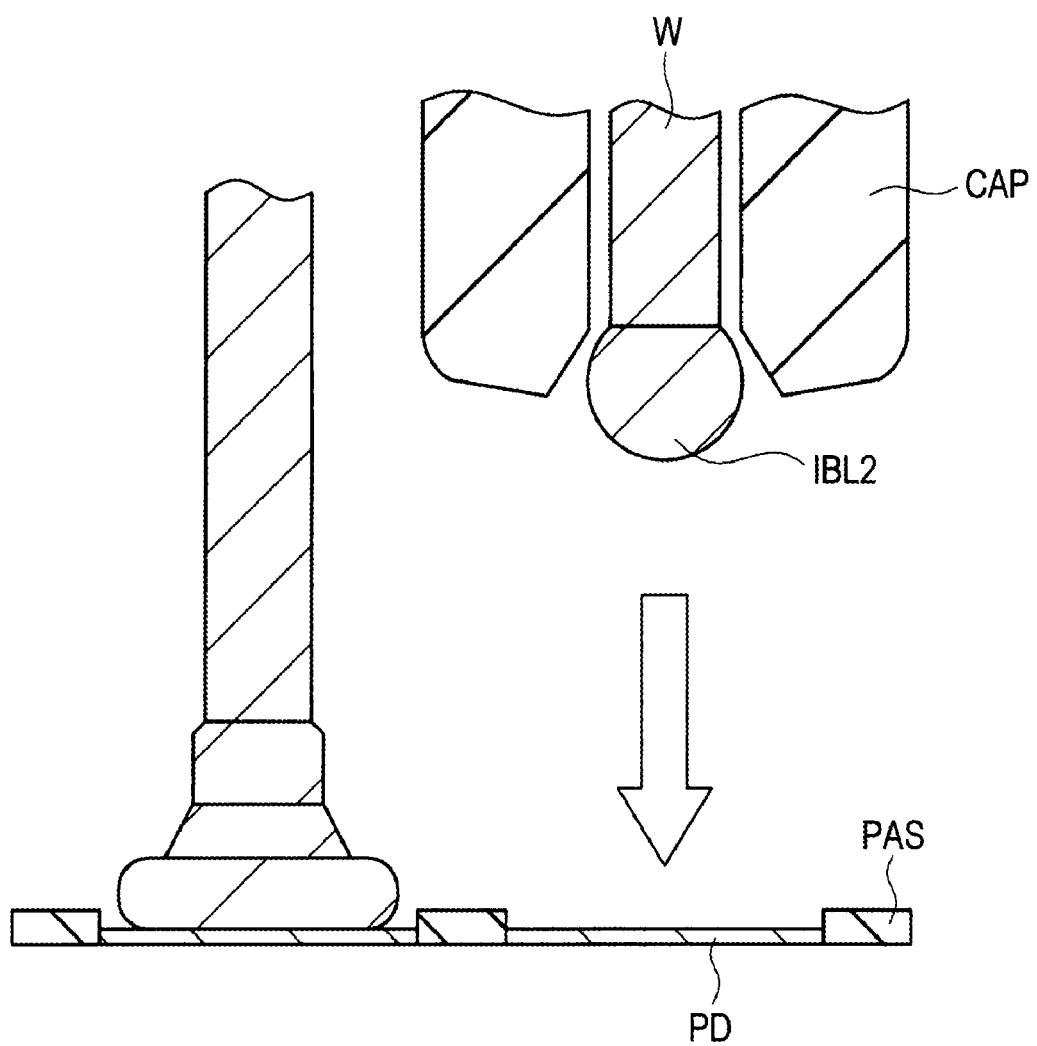
FIG. 21 is a cross-sectional view showing a first bonding step of a small-diameter initial ball onto a pad.
Figure 22:
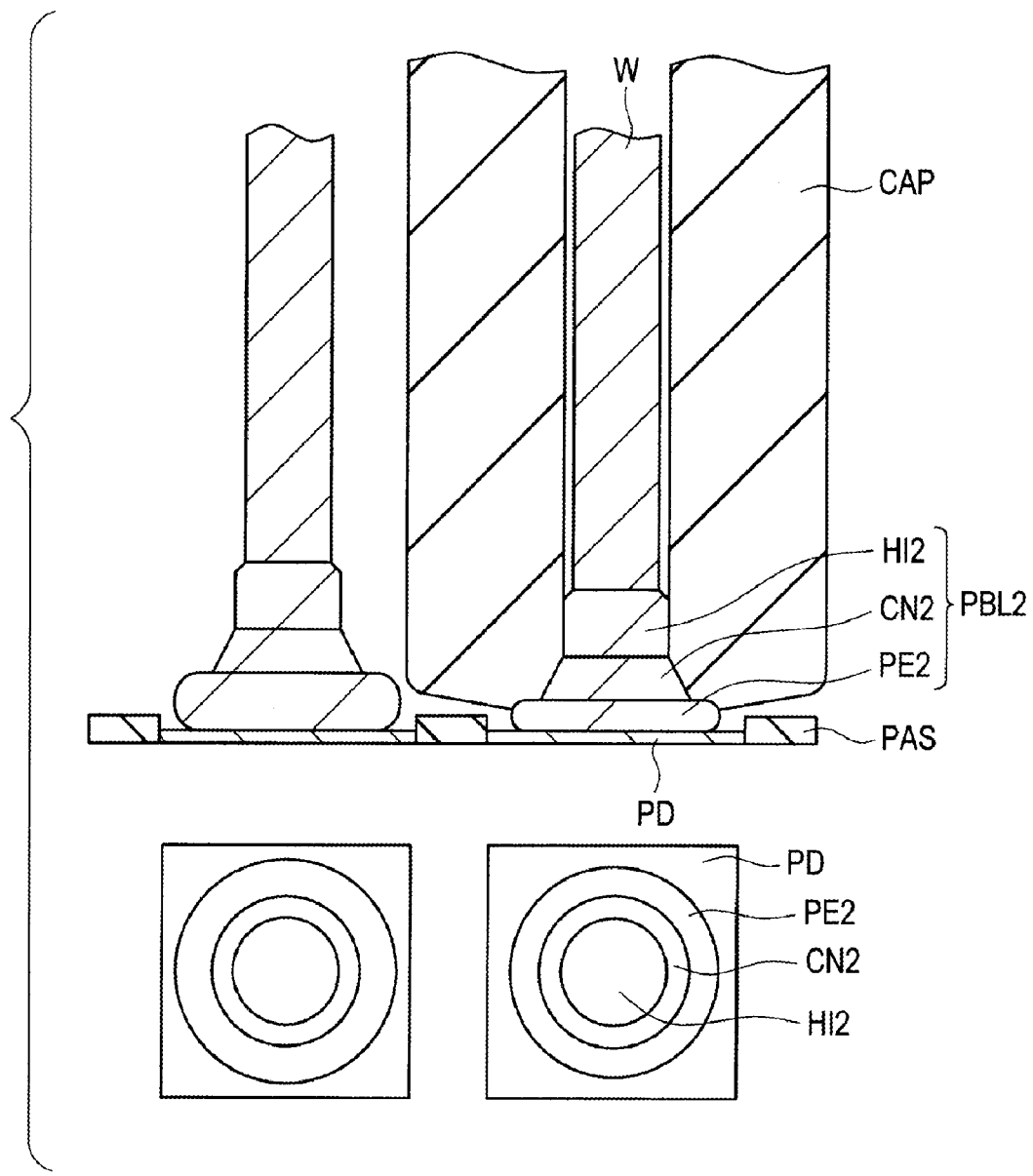
FIG. 22 is another cross-sectional view showing the first bonding step of a small-diameter initial ball onto the pad.

A description will next be made on another abnormal state, that is, a decrease in the diameter of an initial ball IBL2 compared with the appropriate diameter due to a variation in the ball diameter of the initial ball IBL2. FIG. 21 and FIG. 22 are cross-sectional views showing a first bonding step of the initial ball IBL2 having a small diameter on the pad PD. As shown in FIG. 21, the capillary CAP has, at the tip portion thereof, the initial ball IBL2, but the initial ball IBL2 shown in FIG. 21 is in an abnormal state because it has a ball diameter small than the appropriate diameter. The capillary CAP has such an initial ball IBL2 at the tip portion and by lowering this capillary CAP, the initial ball IBL2 is landed on the pad PD. As shown in FIG. 22, the initial ball IBL2 landed on the pad PD is deformed into a press-bonded ball PBL2 by the load and ultrasonic oscillation from the capillary CAP and the heat load from the heat plate placed below the semiconductor chip. This press-bonded ball PBL2 is included of a pedestal portion PE2, a cone portion CN2 formed on the pedestal portion PE2, and a hole insertion portion HI2 formed on the cone portion CN2. At this time, the above-described load, ultrasonic oscillation, and heat load are applied to the initial ball IBL2 shown in FIG. 21. However, the initial ball IBL2 has a ball diameter smaller than the appropriate ball diameter and is therefore in an abnormal state so that the volume of the pedestal portion PE2 formed as a result of deformation of the initial ball IBL2 decreases. Supposing that the load from the capillary CAP is the same, a decrease in the volume of the pedestal portion PE2 means an increase in the load applied per unit volume of the pedestal portion PE2. This suggests an increase in the load applied per unit volume of the pad PD which is in contact with the bottom layer of the pedestal portion PE2. As a result, damage added to the pad PD becomes severe and the semiconductor device thus obtained has reduced reliability inevitably.

Figure 23:
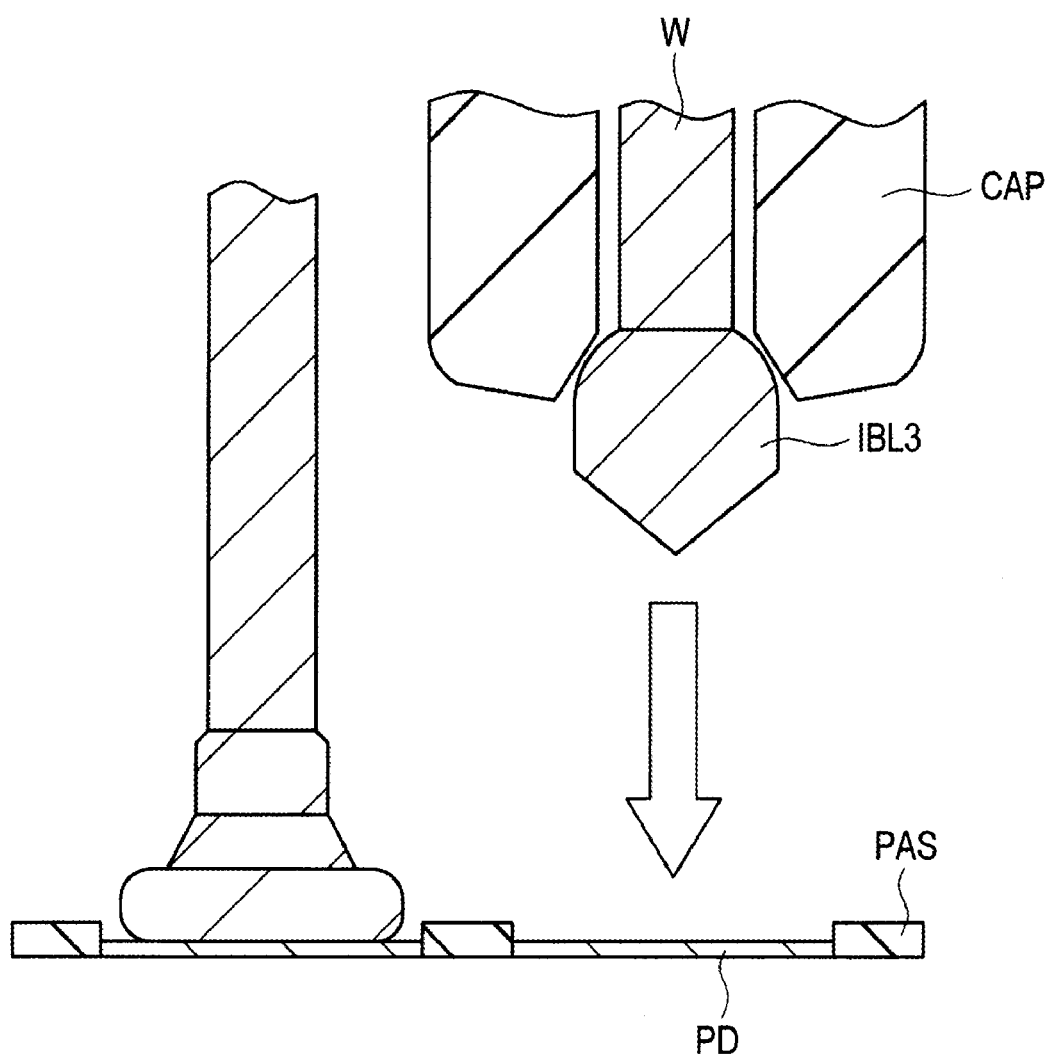
FIG. 23 is a cross-sectional view showing a first bonding step of an initial ball with a protruding end onto a pad.
Figure 24:
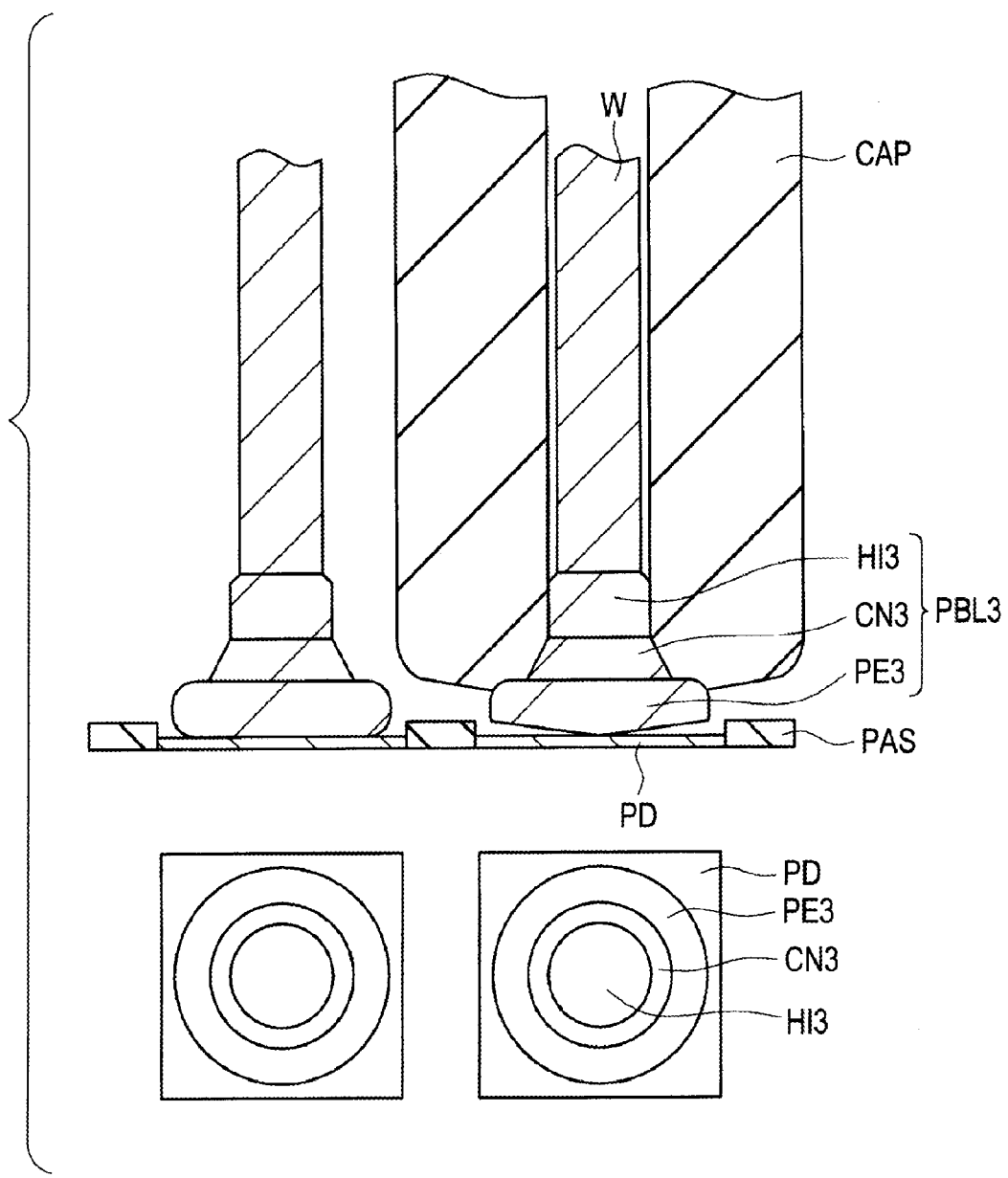
FIG. 24 is another cross-sectional view showing the first bonding step of an initial ball with a protruding end onto the pad.

A description will next be made on a further abnormal state of an initial ball IBL3, that is, the initial ball IBL3 not having a normal shape but having a protruding end and thus being in an abnormal state. FIG. 23 and FIG. 24 are cross-sectional views showing the first bonding step of the initial ball IBL3 having a protruding end onto the pad PD. As shown in FIG. 23, the capillary CAP has, at the tip portion thereof, the initial ball IBL3. The initial ball IBL3 shown in FIG. 23 however has a protruding end portion and is therefore in an abnormal state. The initial ball IBL3 having such a shape is formed at the tip portion of the capillary CAP and by lowering this capillary CAP, the initial ball IBL3 is landed on the pad PD. As shown in FIG. 24, the initial ball IBL3 landed on the pad PD is deformed into a press-bonded ball PBL3 by the load and ultrasonic oscillation from the capillary CAP and a heat load from a heat plate placed below a semiconductor chip. This press-bonded ball PBL3 is included of a pedestal portion PE3, a cone portion CN3 formed on the pedestal portion PE3, and a hole insertion portion HI3 formed on the cone portion CN3. At this time, the load, ultrasonic oscillation, and heat load are applied to the initial ball IBL3 shown in FIG. 23. However, the initial ball IBL3 shown in FIG. 23 has a protruding end and is in an abnormal state, the bottom surface of the pedestal portion PE3 formed by the deformation of the initial ball IBL3 has a convex portion, reflecting the protruding end shape of the initial ball IBL3. This means that a load is concentrated on the convex portion present in the pedestal portion PE3 and from this convex portion of the pedestal portion PE3, a large load is applied partially to the pad PD. As a result, damage added to the pad PD increases and the semiconductor device thus obtained has reduced reliability inevitably.

It has been found from the above description that in order to prevent the pad PD from being damaged in the wire bonding step, it is important to control the initial ball IBL formed at the tip portion of the capillary CAP to a normal state, more specifically, control the ball to have a true sphere, an appropriate ball diameter, no eccentricity, and an unoxidized surface. In other words, it has been found that it is necessary to avoid the initial ball IBL from having an abnormal shape as much as possible from the standpoint of suppressing damage to the pad PD and obtaining a semiconductor device having improved reliability.

<Occurrence Mechanism of Abnormal Shape of Initial Ball in Studied Constitutions> Study by the present inventors has revealed that the occurrence of the abnormal shape of an initial ball is easily influenced by the flow of an antioxidant gas supplied from a gas inlet portion to a ball formation portion BFP in a ball formation unit. A description will next be made on the frequent occurrence mechanism of the abnormal shape of an initial ball while using, as an example, Study Example 1 and Study Example 2 studied by the present inventors.

Figure 25A:
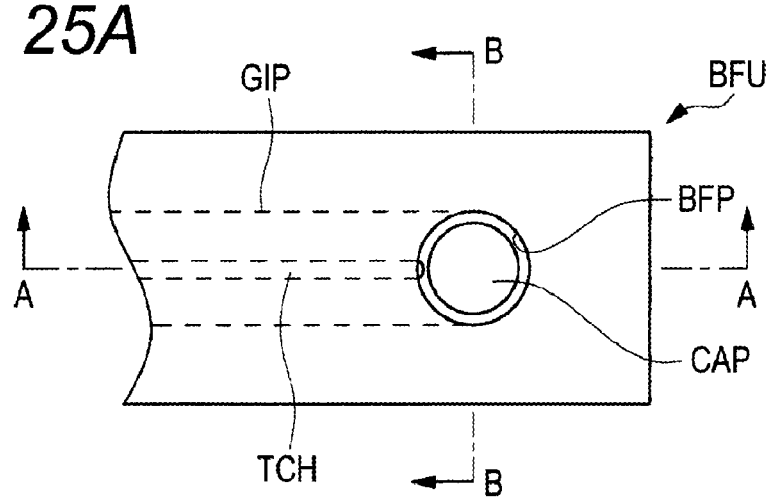
FIGS. 25($a$), 25($b$), and 25($c$) show the constitution of a ball formation unit studied by the present inventors in Study Example 1, in which FIG. 25($a$) is a plan view showing a portion of a ball formation unit in Study Example 1, FIG. 25($b$) is a cross-sectional view taken along the line A-A in FIG. 25($a$), and FIG. 25($c$) is a cross-sectional view taken along the line B-B in FIG. 25($a$)
Figure 25B:
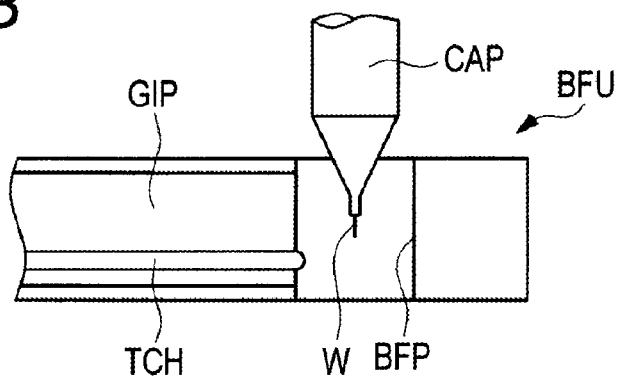
Figure 25C:
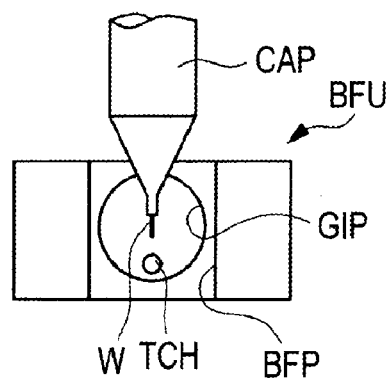

FIG. 25(a) to FIG. 25(c) show the constitution of a ball formation unit BFU studied by the present inventors in Study Example 1. In particular, FIG. 25(a) is a plan view showing a portion of the ball formation unit BFU in Study Example 1; FIG. 25(b) is a cross-sectional view taken along a line A-A of FIG. 25(a). FIG. 25(c) is a cross-sectional view taken along the line B-B of FIG. 25(a).

In FIG. 25(a), the ball formation unit BFU in Study Example 1 is equipped with a ball formation portion BFP in which a tip portion of a capillary CAP is placed and a torch electrode TCH which protrudes and is exposed from the inner wall of this ball formation portion BFP. The ball formation unit BFU is equipped further with a gas inlet portion GIP for introducing an antioxidant gas into the ball formation portion BFP. Examples of the antioxidant gas introduced from the gas inlet portion GIP to the ball formation portion BFP include inert gases such as nitrogen gas and argon gas and a forming gas obtained by mixing a nitrogen gas which is an inert gas with a hydrogen gas which is a reducing gas. As shown in FIGS. 25(b) and 25(c), he ball formation portion BFP penetrates through the ball formation unit BFU in the thickness direction thereof to enable insertion of the capillary CAP in this ball formation portion BFP. In the ball formation unit BFU of Study Example 1 having such a constitution, after the tip portion of the capillary CAP is placed in the ball formation portion BFP, arc discharge is generated between the wire W extending from the tip portion of the capillary and the torch electrode TCH, while supplying the antioxidant gas into the ball formation portion BFP. An initial ball can thus be formed at the tip portion of the capillary CAP.

It was found from the formation of an initial ball in the ball formation unit BFU in Study Example 1 that there was a variation in the diameter of the initial ball thus formed. Such a variation in ball diameter means inevitable formation of an abnormal initial ball, that is, an initial ball having a diameter smaller than an appropriate ball diameter. Formation of an initial ball having such a small diameter leads to a decrease in the volume of a pedestal portion to be formed by the deformation of the initial ball. Then, a load applied per unit volume of the pedestal portion increases so that a load applied per unit area of the pad which is in contact with the bottom layer of the pedestal portion increases. As a result, damage added to the pad increases and the semiconductor device thus obtained has reduced reliability.

The present inventors therefore investigated a reason why there occurred a variation in diameter of an initial ball formed in the ball formation unit BFU in Study Example 1. In practice, a white gas was used to visually observe the flow of the antioxidant gas. As a result, the variation in diameter of an initial ball is presumed to occur because of the following factors. A description will next be made on these factors.

Figure 26A:
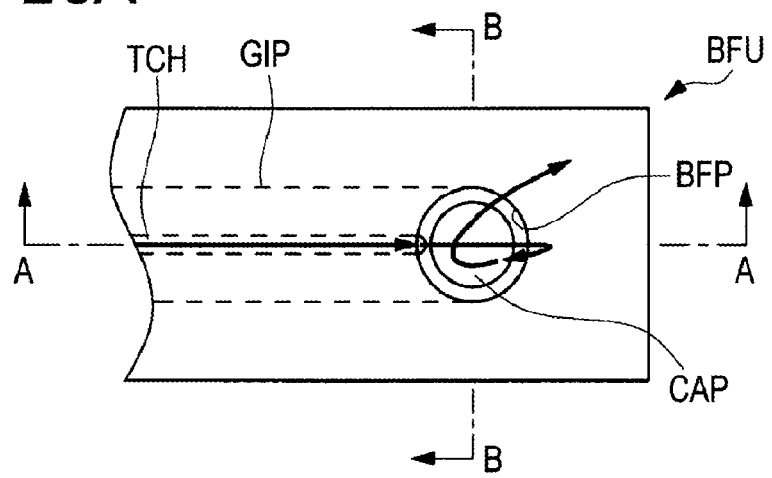
FIGS. 26($a$), 26($b$), and 26($c$) are schematic views showing the flow of an antioxidant gas in Study Example 1, in which FIGS. 26($a$), 26($b$), and 26($c$) correspond to FIG. 25($a$), FIG. 25($b$), and FIG. 25($c$), respectively.
Figure 26B:
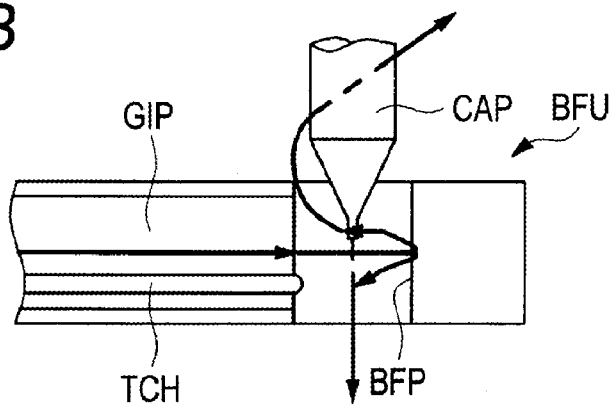
Figure 26C:
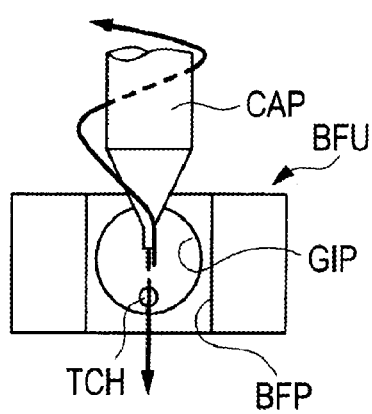

FIGS. 26(a), 26(b), and 26(c) are schematic views showing the flow of an antioxidant gas in Study Example 1. FIG. 26(a) to FIG. 26(c) correspond to FIG. 25(a) to FIG. 25(c), respectively and the flow of the antioxidant gas is shown by an arrow. First, the first factor causing the variation in the diameter of an initial ball in Study Example 1 is presumed to be the following one. As shown in FIG. 26(a) and FIG. 26(b), the antioxidant gas introduced from the gas inlet portion GIP to the ball formation portion BFP is presumed to be discharged in the vertical direction of the ball formation portion BFP penetrating through the ball formation unit BFU in a thickness direction thereof. In this case, the gas is discharged in the vertical direction of the ball formation portion BFP while a gas flow supplied from the side of one side surface of the ball formation portion BFP and a reflected gas flow from the other side surface opposite thereto collide to each other to form a turbulent flow. In short, in the constitution of Study Example 1, a gas flow supplied from the side of one side surface of the ball formation portion BFP collides with a reflected gas flow from the other side opposite thereto to form a turbulent flow. As a result, it is presumed that the diameter of an initial ball varies because the gas flow in the vicinity of the wire extending from the end portion of the capillary CAP varies due to the turbulence.

Furthermore, in Study Example 1, a second factor causing a variation in the diameter of an initial ball is presumed to be as follows. Described specifically, as shown in FIG. 26(b) and FIG. 26(c), the antioxidant gas to be discharged in the upper direction of the ball formation portion BFP is not discharged smoothly because the gas flow is disturbed by the capillary CAP inserted. In short, it is presumed that since the flow of the antioxidant gas discharged in the upper direction of the ball formation portion BFP is disturbed by the capillary CAP and spirals, the flow rate of the antioxidant gas becomes unstable, resulting in a variation in the diameter of the initial ball.

Figure 27A:
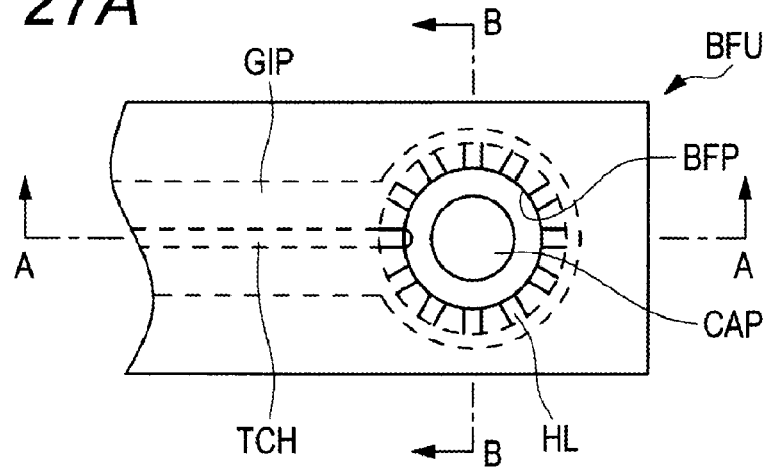
FIGS. 27($a$), 27($b$), and 27($c$) show the constitution of a ball formation unit studied by the present inventors in Study Example 2, in which FIG. 27($a$) is a plan view showing a portion of a ball formation unit in Study Example 2, FIG. 27($b$) is a cross-sectional view taken along the line A-A in FIG. 27($a$), and FIG. 27($c$) is a cross-sectional view taken along the line B-B in FIG. 27($a$)
Figure 27B:
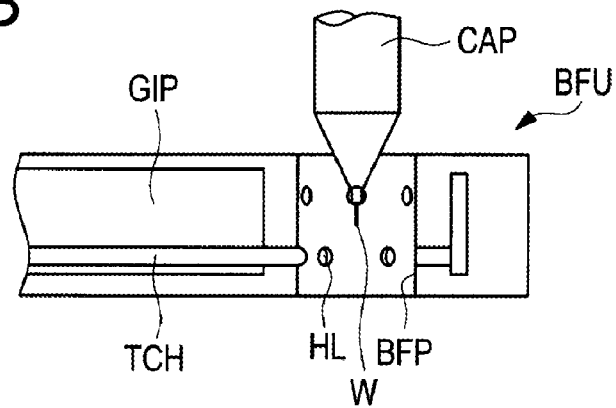
Figure 27C:
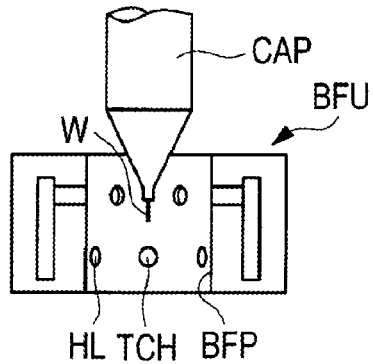

Next, FIGS. 27(a), 27(b), and 27(c) show the constitution of a ball formation unit BFU studied by the present inventors in Study Example 2. In particular, FIG. 27(a) is a plan view showing a portion of the ball formation unit BFU in Study Example 2 and FIG. 27(b) is a cross-sectional view taken along the line A-A of FIG. 27(a). FIG. 27(c) is a cross-sectional view taken along the line B-B of FIG. 27(a).

First, in FIG. 27(a), the ball formation unit BFU in Study Example 2 is equipped with a ball formation portion BFP in which a tip portion of a capillary CAP is placed and a torch electrode TCH which protrudes and is exposed from the inner wall of this ball formation portion BFP. The ball formation unit BFU is equipped further with a gas inlet portion GIP for introducing an antioxidant gas into the ball formation portion BFP. Examples of the antioxidant gas introduced from the gas inlet portion GIP into the ball formation portion BFP include inert gases such as nitrogen gas and argon gas and a forming gas obtained by mixing a nitrogen gas which is an inert gas with a hydrogen gas which is a reducing gas. In Study Example 2, the antioxidant gas to be supplied from the gas inlet portion GIP to the ball formation portion BFP is introduced into the ball formation portion BFP from a plurality of injection holes provided around the ball formation portion BFP. Further, as shown in FIG. 27(b) and FIG. 27(c), the ball formation portion BFP penetrates through the ball formation unit BFU in the thickness direction thereof to enable insertion of the capillary CAP through this ball formation portion BFP. These drawings show that a plurality of injection holes HL for introducing the antioxidant gas is provided in the side surface of the ball formation portion BFP. In the ball formation unit BFU of Study Example 2 having such a constitution, after the tip portion of the capillary CAP is placed inside the ball formation portion BFP, arc discharge is generated between the wire W extending from the tip portion of the capillary and the torch TCH while supplying the antioxidant gas from the plurality of injection holes HL to the ball formation portion BFP. This enables formation of an initial ball at the tip portion of the capillary CAP.

When an initial ball was formed in the ball formation unit BFU of Study Example 2, it was found that the initial ball thus formed had an eccentricity or had a small ball diameter. Negative effects due to the eccentricity or small ball diameter of the initial ball are as described above in Study Example 1.

The reason why the initial ball formed in the ball formation unit BFU of Study Example 2 had an eccentricity or a small diameter was studied in a similar manner to that employed in Study Example 1. As a result, the eccentricity or small diameter of the initial ball is presumed to occur because of the following factors. A description will next be made on these factors.

Figure 28A:
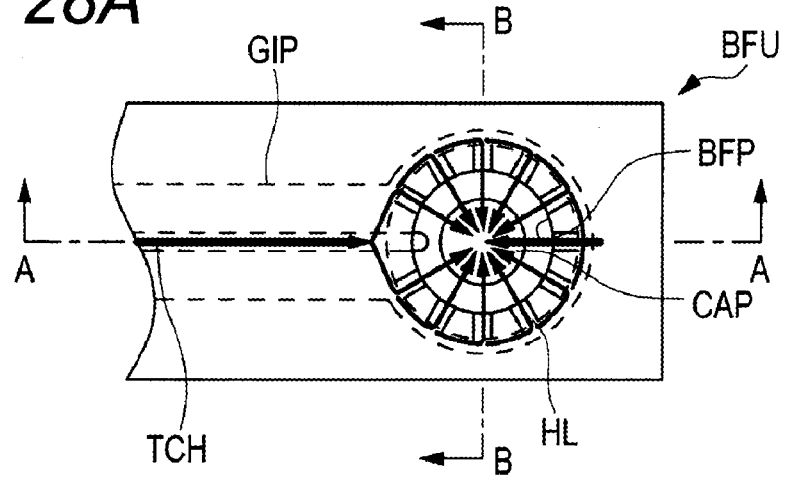
FIGS. 28($a$), 28($b$), and 28($c$) are schematic views showing the flow of an antioxidant gas in Study Example 2, in which FIGS. 28($a$), 28($b$), and 28($c$) correspond to FIGS. 27($a$), FIG. 27($b$), and FIG. 27($c$), respectively.
Figure 28B:
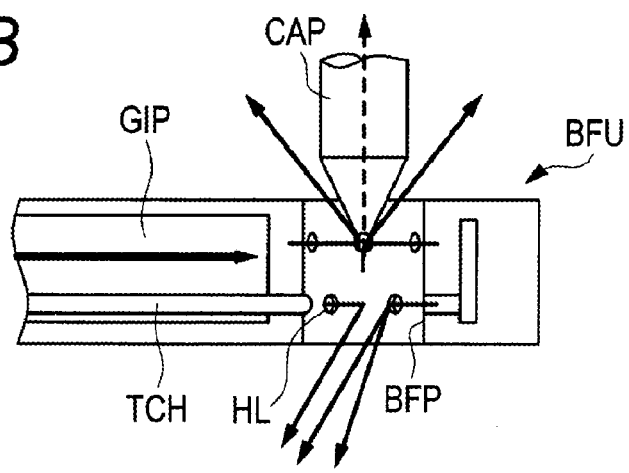
Figure 28C:
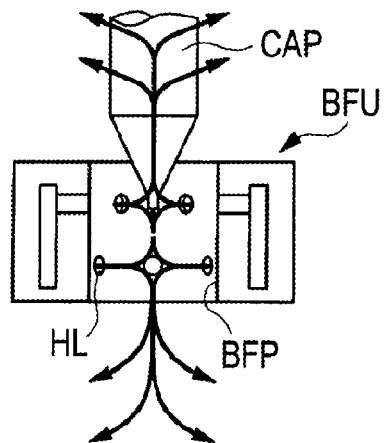

FIGS. 28(a), 28(b), and 28(c) are schematic views showing the flow of the antioxidant gas in Study Example 2, in which FIG. 28(a) to FIG. 28(c) correspond to FIG. 27(a) to FIG. 27(c), respectively and the flow of the antioxidant gas is shown by an arrow. First, in Study Example 2, the eccentricity of the initial ball is presumed to occur because of the following factor. Described specifically, as shown in FIG. 28(a), the antioxidant gas is introduced from the gas inlet portion GIP to the ball formation portion BBFP via a plurality of injection holes HL. It is presumed that no eccentricity of the initial ball occurs when the antioxidant gas is supplied uniformly from the plurality of injection holes HL placed around the ball formation portion BFP. Actually, however, as shown in FIG. 28(a), depending on the position where the injection holes are placed, gases jetted from respective injection holes HL collide with each other, which causes a difference in the magnitude of the gas flow. As a result, the gas flow to be brought into contact with the initial ball differs, depending on the direction so that the initial ball thus formed inevitably has an eccentricity.

Furthermore, the initial ball is presumed to have a smaller diameter in Study Example 2 because of the following factor. Described specifically, as shown in FIG. 28(b) and FIG. 28(c), the opening areas of respective injection holes HL are small so that the flow rate of the antioxidant gas to be jetted into the ball formation portion BFP from the injection holes HL having a small opening area becomes greater than the flow rate of the antioxidant gas in the gas inlet portion GIP. This means an increase in the flow rate of the antioxidant gas to be brought into contact with the initial ball, which further means enhancement in the cooling effect of the initial ball by the antioxidant gas. It is therefore presumed that the melted wire solidifies before the initial ball acquires an appropriate diameter, causing a decrease in the diameter of the initial ball.

As described above, in either Study Example 1 or Study Example 2, it has been found that the abnormal shape of the initial ball occurs, influenced by the flow of the antioxidant gas introduced from the gas inlet portion into the ball formation portion BFP in the ball formation unit. In the first embodiment, therefore, the flow of the antioxidant gas in the ball formation unit is improved (optimized) in order to prevent generation of the abnormal shape of the initial ball. A description will next be made on the technical concept of this improvement in the first embodiment.

Figure 29A:
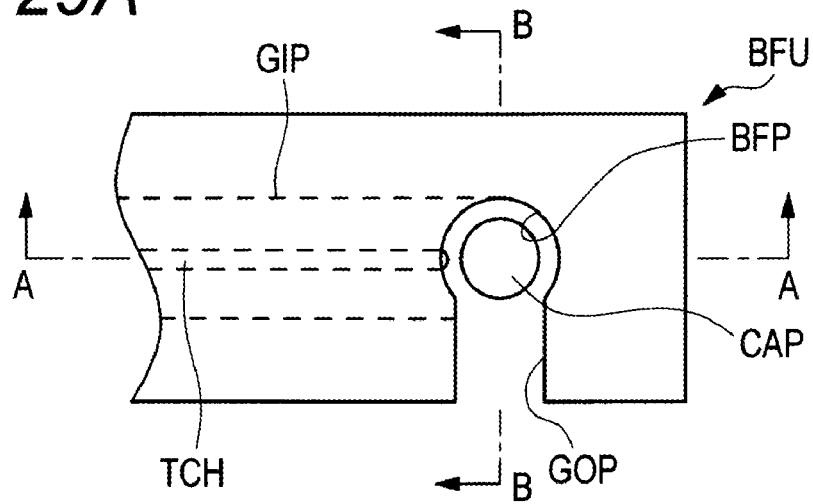
FIGS. 29($a$), 29($b$), and 29($c$) show the constitution of a ball formation unit in First Embodiment, in which FIG. 29($a$) is a plan view showing a portion of the ball formation unit in First Embodiment, FIG. 29($b$) is a cross-sectional view taken along the line A-A in FIG. 29($a$), and FIG. 29($c$) is a cross-sectional view taken along the line B-B in FIG. 29($a$)
Figure 29B:
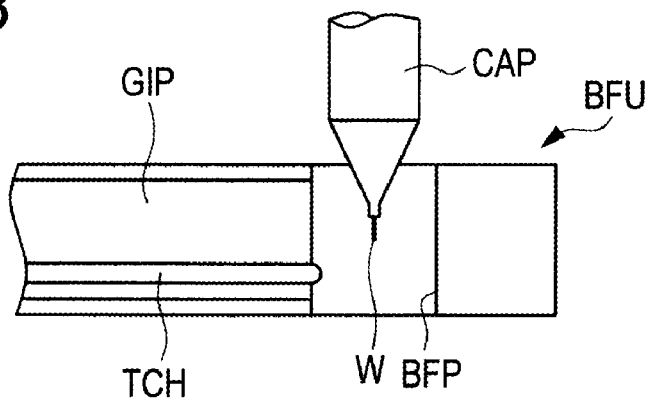
Figure 29C:
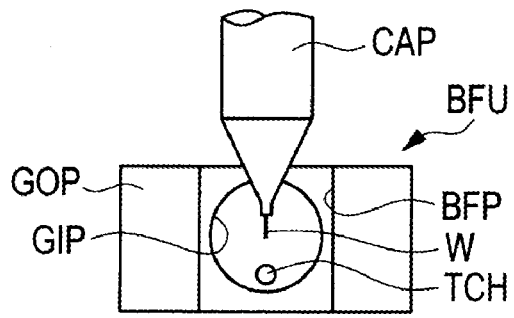

<Structure of Ball Formation Unit in First Embodiment (Characteristics of the Invention)> FIGS. 29(a), 29(b), and 29(c) show the constitution of a ball formation unit BFU in the first embodiment, in which FIG. 29(a) is a plan view showing a portion of the ball formation unit in the first embodiment, FIG. 29(b) is a cross-sectional view taken along the line A-A in FIG. 29(a), and FIG. 29(c) is a cross-sectional view taken along the line B-B in FIG. 29(a).

First, in FIG. 29(a), a ball formation unit BFU of the first embodiment is equipped with a ball formation portion BFP in which the tip portion of a capillary CAP is placed and a torch electrode TCH which protrudes and is exposed from the inner wall of this ball formation portion BFP. The ball formation unit BFU is provided further with a gas inlet portion GIP for introducing an antioxidant gas into the ball formation portion BFP. Examples of the antioxidant gas introduced from the gas inlet portion GIP into the ball formation portion BFP include inert gases such as nitrogen gas and argon gas and a forming gas obtained by mixing a nitrogen gas which is an inert gas with a hydrogen gas which is a reducing gas. When a forming gas obtained by mixing a nitrogen gas with a hydrogen gas is used, it is necessary to add the hydrogen gas at a concentration less than 5% in order to prevent explosion due to the hydrogen gas. As shown in FIGS. 29(b) and 29(c), the ball formation portion BFP penetrates through the ball formation unit BFU in the thickness direction thereof, which enables insertion of the capillary CAP into this ball formation portion BFP. In the ball formation unit BFU of the first embodiment having such a constitution, after the tip portion of the capillary CAP is placed in the ball formation portion BFP, arc discharge is generated between a wire W extending from the tip portion of the capillary and the torch electrode TCH while supplying the antioxidant gas to the ball formation portion BFP. This enables formation of an initial ball at the tip portion of the capillary CAP. Thus, since in the ball formation unit BFU, arc discharge is generated between the wire extending from the end portion of the capillary and the torch electrode TCH, a member constituting the ball formation unit BFU is required to have an insulating property. Further, the ball formation unit BFU is placed, for example, above the heat plate HP as shown in FIG. 14(a). The atmospheric temperature in the vicinity of the ball formation unit BFU reaches at from about 100° C. to 120° C. due to the radiation heat from the heat plate HP so that the ball formation unit BFU is required to have resistance to temperatures of from about 100° C. to 120° C. As described above, the member constituting the ball formation unit BFU is required to have an insulation property and heat resistance. From this standpoint, for example, a polyamide imide resin, ceramic, or glass is used for the ball formation unit BFU. In particular, when a polyamide imide resin is used, the polyamide imide resin is excellent in processability and is resistant to cracks so that it can improve the processability and also reliability of the ball formation unit BFU.

The first embodiment is characterized in that as shown in FIG. 29(a), the ball formation unit BFU is equipped with a gas outlet portion GOP for discharging the antioxidant gas and a discharge path through this gas outlet portion GOP is provided in a direction different from a direction of introducing the antioxidant gas into the ball formation portion BFP. In other words, the first embodiment is characterized in that a direction of introducing (supplying) the antioxidant gas through the gas inlet portion GIP is different from a direction of discharging the antioxidant gas through the gas outlet portion GOP. According to this characteristic in the first embodiment, a region for discharging the antioxidant gas can be widened, making it possible to prevent a gas flow supplied from the side of one side surface of the ball formation portion BFP from being reflected by the other side surface, which is opposite to the one side surface, and forming a turbulent flow. As a result, the gas flow in the ball formation portion BFP can be stabilized.

For example, in the case of Study Example 1 (refer to FIG. 25) described above, the path for discharging the antioxidant gas supplied from the gas inlet portion GIP to the ball formation portion BFP is present only in the vertical direction of the ball formation portion BFP penetrating through the ball formation unit BFU in the thickness direction thereof. Moreover, the tip portion of the capillary CAP placed in the upper portion of the ball formation portion BFP considerably narrows the path for discharging the antioxidant gas, making it difficult to discharge the antioxidant gas introduced into the ball formation portion BFP. Then, the gas supplied from the gas inlet portion GIP to the ball formation portion BFP cannot be discharged smoothly and the antioxidant gas introduced in the ball formation portion BFP collides, with a high probability, against the side surface opposite to the side of the one side surface of the ball formation portion BFP in which the gas has been supplied. As a result, a gas flow supplied from the side of the one side surface of the ball formation portion BFP and a reflected gas flow from the other side surface opposite to the one side surface are likely to collide with each other to form a turbulent flow. When this turbulent flow occurs, a gas flow in the vicinity of the wire appearing from the tip portion of the capillary CAP is changed by this turbulent flow, resulting in the problem, that is, a variation in the diameter of the initial ball.

Figure 30A:
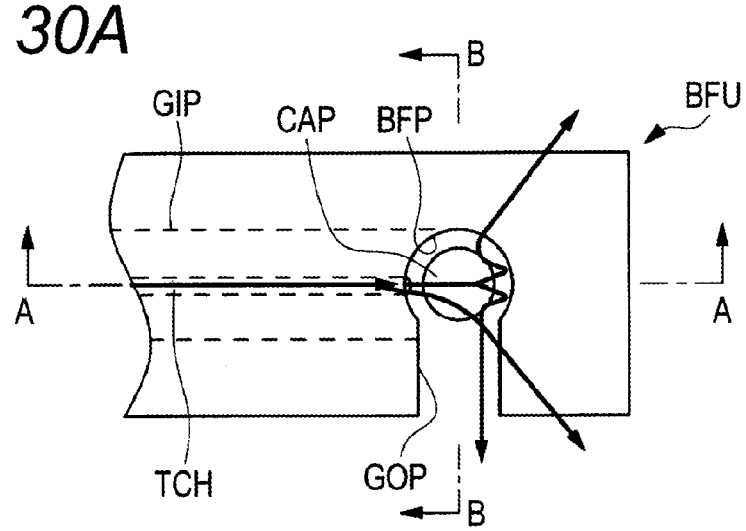
FIGS. 30($a$), 30($b$), and 30($c$) are schematic views showing the flow of an antioxidant gas in First Embodiment, in which FIGS. 30($a$), 30($b$), and 30($c$) correspond to FIG. 29($a$), FIG. 29($b$), and FIG. 29($c$), respectively.
Figure 30B:
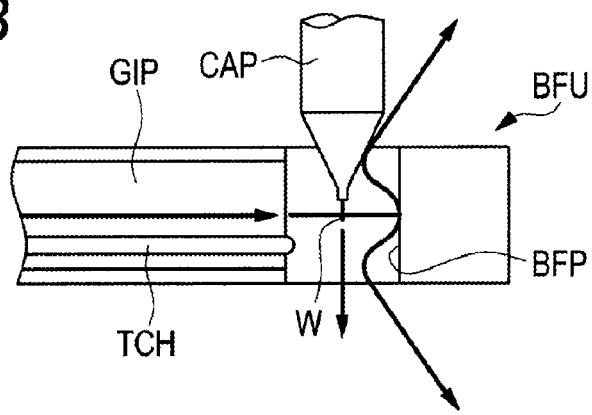
Figure 30C:
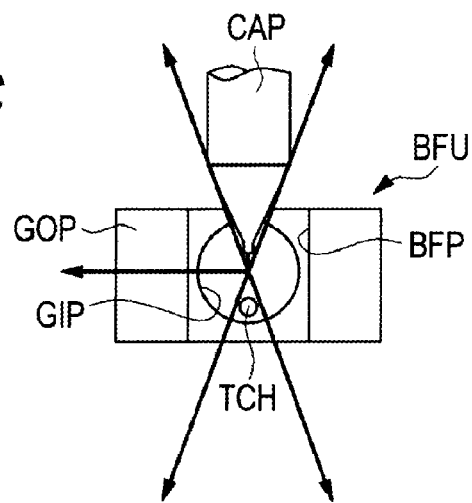

On the other hand, a description will next be made on the ball formation unit BFU of the first embodiment. FIGS. 30(a), 30(b), and 30(c) are schematic views showing the flow of the antioxidant gas in the first embodiment, in which FIGS. 30(a), 30(b), and 30(c) correspond to FIG. 29(a), FIG. 29(b), and FIG. 29(c), respectively and the flow of the antioxidant gas is shown by an arrow. In the ball formation unit BFU of the first embodiment, as shown in FIG. 30(a), the gas outlet portion GOP for discharging the antioxidant gas is provided. This means that in the first embodiment, a path for discharging the antioxidant gas introduced from the gas inlet portion GIP is not only the vertical direction of the ball formation portion BFP penetrating through the ball formation unit BFU in the thickness direction thereof but also this gas outlet portion GOP. In the first embodiment, the gas outlet portion GOP is added as a path for discharging the antioxidant gas so that the antioxidant gas supplied to the ball formation portion BFP can be discharged efficiently from the gas outlet portion GOP. In particular, the capillary CAP itself is not placed and therefore no member disturbing the discharge of the antioxidant gas is placed in the gas outlet portion GOP so that the antioxidant gas can be discharged sufficiently from the gas outlet portion GOP. This means that in the first embodiment, most of the antioxidant gas supplied from the gas inlet portion GIP to the ball formation portion BFP is discharged from the gas outlet portion GOP newly provided (refer to FIG. 30(a) and FIG. 30(b)). According to the first embodiment, the flow rate of the antioxidant gas not discharged from the gas outlet portion GOP relative to the antioxidant gas supplied to the ball formation portion BFP decreases so that the remaining antioxidant gas can be discharged smoothly from the vertical direction of the ball formation portion BFP inferior in discharge capacity (refer to FIG. 30(b) and FIG. 30(c)). In short, in the first embodiment, it is possible to efficiently discharge the antioxidant gas supplied to the ball formation portion BFP by providing the gas outlet portion GOP having a large discharge capacity, which is a direct first effect. In addition, it is possible to decrease the flow rate of the antioxidant gas not discharged from the gas outlet portion GOP because most of the antioxidant gas is discharged from the gas outlet portion GOP, which is an indirect second effect. This second effect enables smooth discharge of the remaining antioxidant gas from the vertical direction of the ball formation portion BFP inferior in discharge capacity. Due to the synergistic effect of the first effect and the second effect, the antioxidant gas introduced into the ball formation portion BFP from the gas inlet portion GIP can be discharged smoothly. This means that most of the antioxidant gas supplied from the side of one side surface of the ball formation portion BFP is discharged smoothly without colliding against the other side surface opposite to the one side surface to form a turbulent flow. In the first embodiment, it is possible to sufficiently prevent the collision between a gas flow supplied from the side of one side surface of the ball formation portion BFP and a reflected gas flow from the other side surface opposite to the one side surface, thereby preventing formation of a turbulent flow. In other words, for example, even when a gas flow supplied from the side of one side surface of the ball formation portion BFP is reflected by the other side surface opposite to the one side surface, the reflected gas flow is also discharged smoothly from the gas outlet portion GOP so that formation of a turbulent flow due to collision between a gas flow supplied from the side of one side surface of the ball formation portion BFP and a reflected gas flow from the other side surface opposite to the one side surface can be suppressed. The first embodiment therefore makes it possible to stabilize the gas flow in the ball formation portion BFP.

Moreover, the first embodiment is characterized in that the direction of introducing (supplying) the antioxidant gas from the gas inlet portion GIP is different from the direction of discharging the antioxidant gas from the gas outlet portion GOP. For example, from the standpoint of smoothly discharging the antioxidant gas introduced into the ball formation portion BFP from the gas inlet portion GIP, the direction of introducing (supplying) the antioxidant gas and the direction of discharging the antioxidant gas are preferably the same. Such a constitution however causes inconveniences as follows. For example, when the direction of introducing (supplying) the antioxidant gas and the direction of discharging the antioxidant gas are the same, the antioxidant gas flows in one restricted direction from the gas inlet portion GIP to the gas outlet portion GOP. Then, the gas always flows in one restricted direction toward the initial ball formed at the tip portion of the capillary CAP. This means that the initial ball is likely to have an eccentricity due to the gas flow restricted to one direction. From the standpoint of forming an eccentricity-free initial ball at the tip portion of the capillary CAP, it is necessary to avoid a gas flow from being delivered in one restricted direction. In order to form an eccentricity-free initial ball, it is important to smoothly replace an old antioxidant gas discharged from the gas outlet portion GOP with a new antioxidant gas supplied from the gas inlet portion GIP while keeping a stable concentration of the antioxidant gas in the ball formation portion BFP. Accordingly, in the first embodiment, the direction of introducing (supplying) the antioxidant gas from the gas inlet portion GIP is differentiated from the direction of discharging the antioxidant gas from the gas outlet portion GOP. More specifically, for example, as shown in FIG. 29(a), the direction of introducing (supplying) the antioxidant gas from the gas inlet portion GIP is set to form an angle of 90° with the direction of discharging the antioxidant gas from the gas outlet portion GOP. This makes it possible to prevent the gas from flowing in one restricted direction to the initial ball formed at the tip portion of the capillary CAP. As a result, in the present embodiment, it is possible to prevent the initial ball from having an eccentricity due to the gas flow in one restricted direction.

A description will next be made on another characteristic of the first embodiment. For example, as shown in FIG. 29(a) to FIG. 29(c), the first embodiment is characterized in that the gas outlet portion GOP penetrates through the ball formation unit BFU in the thickness direction thereof. This makes it possible to increase the cross-sectional area of the gas outlet portion GOP to the maximum one (corresponding to the thickness of the ball formation unit BFU), thereby increasing the capacity of discharging the antioxidant gas from the gas outlet portion GOP. As a result, the discharge resistance to the antioxidant gas introduced from the gas inlet portion GIP into the ball formation portion BFP can be decreased and the gas can be discharged efficiently from the gas outlet portion GOP. Moreover, the gas outlet portion GOP penetrates through the ball formation unit BFU in the thickness direction thereof so that the cross-sectional area of the gas outlet portion GOP is made greater than the cross-sectional area of the gas inlet portion GIP provided in the ball formation unit BFU. As a result, according to the first embodiment, the flow rate (discharge capacity) of the antioxidant gas which can be discharged from the ball formation portion BFP to the gas discharge portion GOP can be made greater than the flow rate (flow capacity) of the antioxidant gas delivered from the gas inlet portion GIP to the ball formation unit BFP. According to the first embodiment, the antioxidant gas can therefore be discharged smoothly from the ball formation portion BFP.

In addition, an advantage as described below can be obtained by allowing the gas outlet portion GOP to penetrate through the ball formation unit BFU in the thickness direction thereof and at the same time, adjusting the cross-sectional width of the gas outlet portion GOP equal to or greater than the width of the capillary CAP. For example, the capillary CAP at the end of its life should be changed to a new capillary CAP. In the ball formation unit BFU as shown in Study Example 1, the capillary CAP is changed by lifting up the capillary CAP itself, taking it out from the ball formation portion BFP in the ball formation unit BFU, and then changing the capillary CAP with a new one. After the capillary CAP is changed to a new one, it is necessary to lower the capillary CAP and then insert the tip portion of the capillary CAP into the ball formation portion BFP in the ball formation unit BFU.

In the ball formation unit BFU in the first embodiment, on the other hand, the gas outlet portion GOP is provided. This gas outlet portion GOP penetrates through the ball formation unit BFU in the thickness direction thereof and at the same time, the cross-sectional width of the gas outlet portion GOP is made equal to or greater than the width of the capillary CAP. In this constitution, when the capillary CAP is changed with a new one, the capillary CAP can be taken outside from the gas outlet portion GOP not by lifting up the capillary CAP itself but by sliding it in a horizontal direction. After the capillary CAP is changed with a new one while being taken out, the new capillary CAP can be slid in a horizontal direction to insert the tip portion of the capillary CAP in the ball formation portion BFP in the ball formation unit BFU. Thus, in the first embodiment, the capillary CAP itself needs not to be moved up and down upon exchanging work of the capillary CAP so that the first embodiment offers an advantage of improving the work efficiency.

Moreover, in the first embodiment, for example, as shown in FIG. 29(a), the cross-sectional width of the gas outlet portion GOP is made not greater than the width of the ball formation portion BFP. Because, the cross-sectional width of the gas outlet portion GOP equal to or less than the width of the ball formation portion BFP is enough for efficiently discharging the antioxidant gas from the ball formation portion BFP. For example, although the cross-sectional width of the gas outlet portion GOP greater than the width of the ball formation portion BFP seems to improve the discharge efficiency of the antioxidant gas, the discharge efficiency is the same as that in the case where the cross-sectional width of the gas outlet portion GOP and the width of the ball formation portion BFP are almost equal. On the contrary, an excessive increase in the cross-sectional width of the gas outlet portion GOP may cause the outside air to enter the ball formation portion BFP through the gas outlet portion GOP. When the outside air enters the ball formation portion BFP through the gas outlet portion GOP, an inconvenience, that is, oxidation of the surface of the initial ball may occur. Accordingly, from the standpoints of efficiently discharging the antioxidant gas from the ball formation portion BFP and at the same time, preventing the outside air from entering, it is desired to adjust the cross-sectional width of the gas outlet portion GOP to equal to or less than the width of the ball formation portion BFP.

Described specifically, in the ball formation unit BFU according to the first embodiment, for example, the ball formation unit BFU has a thickness of 2.5 mm, the gas inlet portion GIP has a diameter $\phi$ of 2.0 mm, the ball formation portion BFP has a diameter (width) $\phi$ of 2.2 mm, and the gas outlet portion has a cross-sectional width of 1.6 mm.

Figure 31:
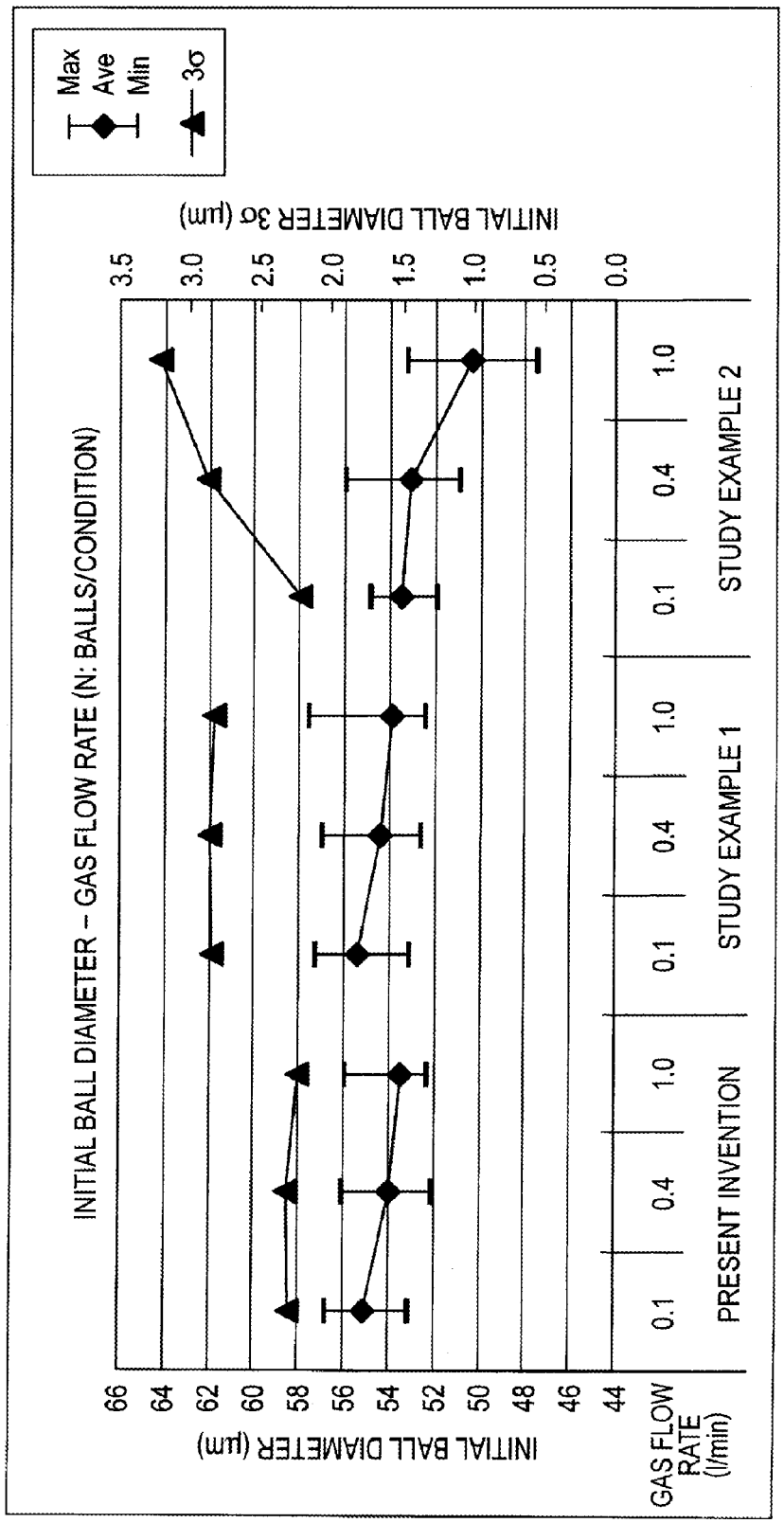
FIG. 31 is a graph showing the relationship between the diameter of an initial ball and a flow rate of an antioxidant gas.

Next, a description will be made on the superiority of the first embodiment while comparing with Study Example 1 or Study Example 2. FIG. 31 is a graph showing the relationship between the diameter of an initial ball and the flow rate of an antioxidant gas. In FIG. 31, the first embodiment is compared with Study Example 1 and Study Example 2. In FIG. 31, the gas flow rate (l/min) is plotted along the abscissa; the maximum value, minimum value, and average value (μm) of the diameter of an initial ball are plotted along the left ordinate; and a deviation (μm) of the diameter of the initial ball is plotted along the right ordinate. As is apparent from FIG. 31, with a change in gas flow rate, the average value or deviation of the diameter of the initial ball varies greatly in Study Example 1 and Study Example 2 compared with the first embodiment. It has therefore been understood that the first embodiment is superior to Study Example 1 or Study Example 2, because it (1) shows a small variation in the diameter of the initial ball, (2) shows a small change in ball diameter even if a gas flow rate changes, and (3) causes no eccentricity even if the gas flow rate increases. This means that according to the first embodiment, even there occurs some change in the flow rate of the antioxidant gas to be introduced in the ball formation unit, the diameter of the initial ball thus formed is stable. In other words, according to the ball formation unit in the first embodiment, a sufficient margin is ensured for a change in the flow rate of the antioxidant gas so that an appropriate initial ball can be formed stably. This suggests that according to the first embodiment, since the gas outlet portion GOP is provided, the antioxidant gas can be discharged stably even if the flow rate of the antioxidant gas changes.

According to the first embodiment, in a wire bonding step using an easily oxidizable metal such as copper or solder for a wire, damage to the pad can be suppressed. This means that in the first embodiment, it is possible to form a normal-state initial ball at the tip portion of the capillary, more specifically, a truly spherical initial ball having an appropriate ball diameter, no eccentricity, and an unoxidized surface. As a result, damage to the pad upon wire bonding due to the eccentricity of the initial ball can be suppressed, making it possible to provide a semiconductor device having improved reliability.

<Modification Example 1 (Discharging Direction from Gas Outlet Portion)> In the example described in the first embodiment, the direction of introducing (supplying) an antioxidant gas from the gas inlet portion is different by from the direction of discharging the antioxidant gas from the gas outlet portion. In the present Modification Example 1, an example in which the introducing direction is different by 90°±45° from the discharging direction will next be described.

Figure 32A:
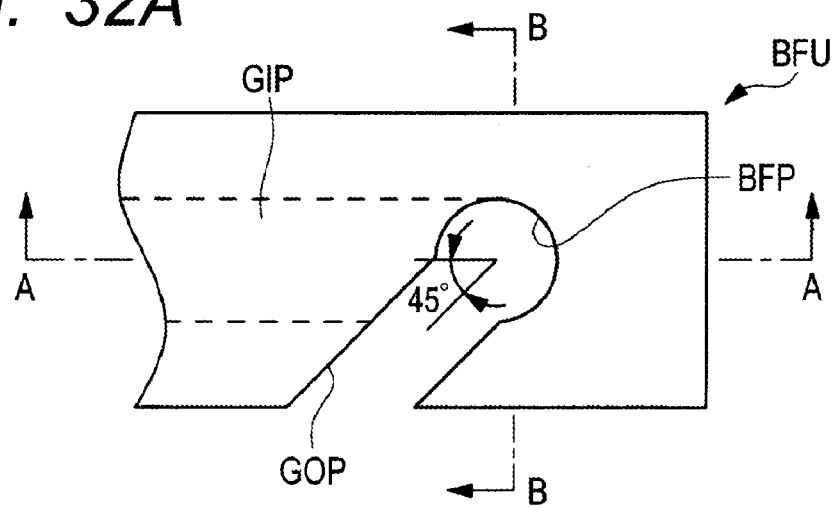
FIGS. 32($a$), 32($b$), and 32($c$) show the constitution of a ball formation unit in Modification Example 1, in which FIG. 32($a$) is a plan view showing a portion of the ball formation unit in Modification Example 1, FIG. 32($b$) is a cross-sectional view taken along the line A-A in FIG. 32($a$), and FIG. 32($c$) is a cross-sectional view taken along the line B-B in FIG. 32($a$)
Figure 32B:
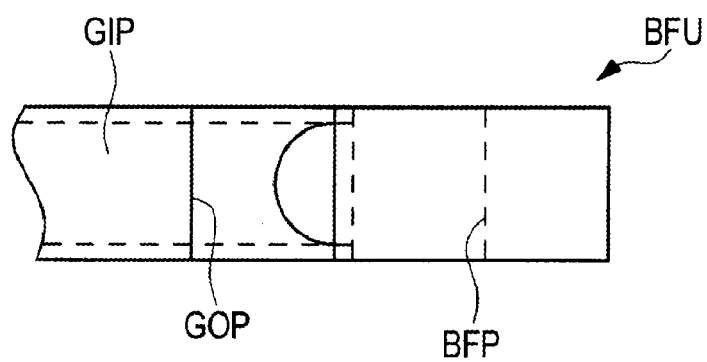
Figure 32C:
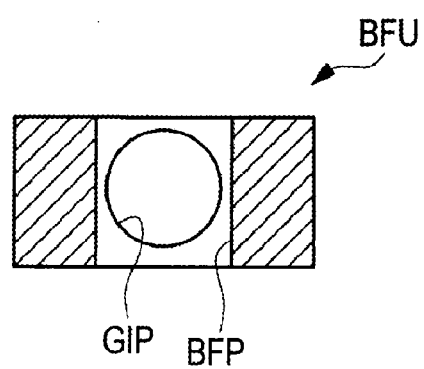
Figure 33A:
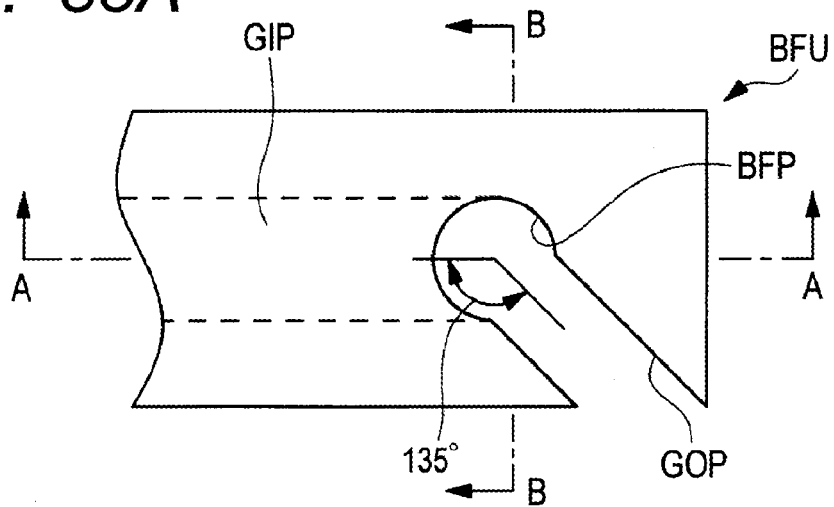
FIGS. 33($a$), 33($b$), and 33($c$) show the constitution of another ball formation unit in Modification Example 1, in which FIG. 33($a$) is a plan view showing a portion of the ball formation unit in Modification Example 1, 33($b$) is a cross-sectional view taken along the line A-A in FIG. 33($a$), and FIG. 33($c$) is a cross-sectional view taken along the line B-B in FIG. 33($a$)
Figure 33B:
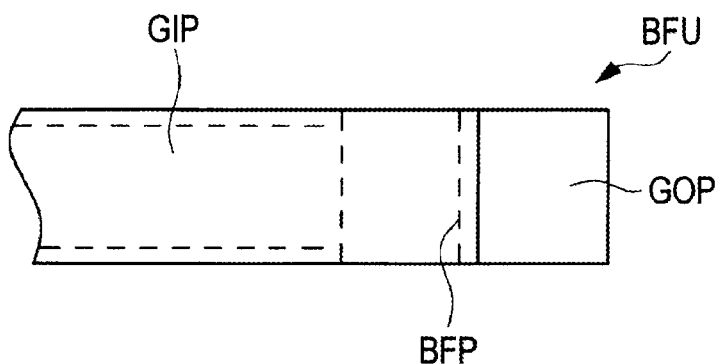
Figure 33C:
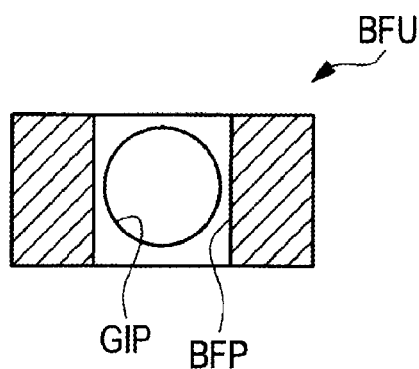

FIGS. 32(a), 32(b), and 32(c) show the constitution of a ball formation unit in Modification Example 1, in which FIG. 32(a) is a plan view showing a portion of the ball formation unit in Modification Example 1, FIG. 32(b) is a cross-sectional view taken along the line A-A in FIG. 32(a), and FIG. 32(c) is a cross-sectional view taken along the line B-B in FIG. 32(a). FIGS. 33(a), 33(b), and 33(c) show the constitution of another ball formation unit in Modification Example 1, in which FIG. 33(a) is a plan view showing a portion of the ball formation unit in Modification Example 1, FIG. 33(b) is a cross-sectional view taken along the line A-A in FIG. 33(a), and FIG. 33(c) is a cross-sectional view taken along the line B-B in FIG. 33(a).

A difference between Modification Example 1 and the first embodiment is that in the first embodiment, the direction of introducing (supplying) the antioxidant gas from the gas inlet portion differs by 90° from the direction of discharging the antioxidant gas from the gas outlet portion, while in this Modification Example 1, the introducing direction differs by 90°±45° from the discharging direction. Even in Modification Example 1 having such a constitution, advantages similar to those available from the first embodiment can also be obtained. Described specifically, in Modification Example 1, the ball formation unit BFU is equipped with a gas outlet portion GOP for discharging the antioxidant gas and a discharge path through this gas outlet portion GOP is provided in a direction different from the direction of introducing the antioxidant gas into the ball formation portion BFP. According to Modification Example 1, a region of discharging the antioxidant gas can be widened so that a gas flow supplied from the side of one side surface of the ball formation portion BFP can be suppressed from being reflected by the other side surface opposite to the one side surface to form a turbulent flow. As a result, the gas flow in the ball formation portion BFP can be stabilized. Particularly in Modification Example 1, the direction of introducing (supplying) the antioxidant gas from the gas inlet portion GIP is set at 90°±45° from the direction of discharging the antioxidant gas from the gas outlet portion GOP. This makes it possible to suppress the gas flow from constantly flowing in one restricted direction toward the initial ball formed at the tip portion of the capillary CAP. As a result, in the present embodiment, the eccentricity of the initial ball due to the gas flow in one restricted direction can be prevented.

Thus, in the technical concept of the present invention, the direction of introducing (supplying) the antioxidant gas from the gas inlet portion and the direction of discharging the antioxidant gas from the gas outlet portion preferably make an angle falling within a range of 90°±45°, because when the gas outlet portion GOP having an angle outside the above range is provided, there appear problems such as impossibility of maintaining a gas atmospheric concentration and occurrence of a turbulent flow or a variation in flow rate due to an increase in the resistance against the discharge of the antioxidant gas.

<Modification Example 2 (Cross-Sectional Area of Gas Outlet Portion)> The cross-sectional area of the gas outlet portion GOP is desirably small enough not to disturb the discharge of the antioxidant gas. More specifically, supposing that the cross-sectional area of the gas outlet portion GOP penetrating through the ball formation unit BFU in the thickness direction thereof is 100% (maximum cross-sectional area), the gas outlet portion GOP is desirably provided to give its cross-sectional area of from 50% to 100% of the maximum cross-sectional area.

Figure 34A:
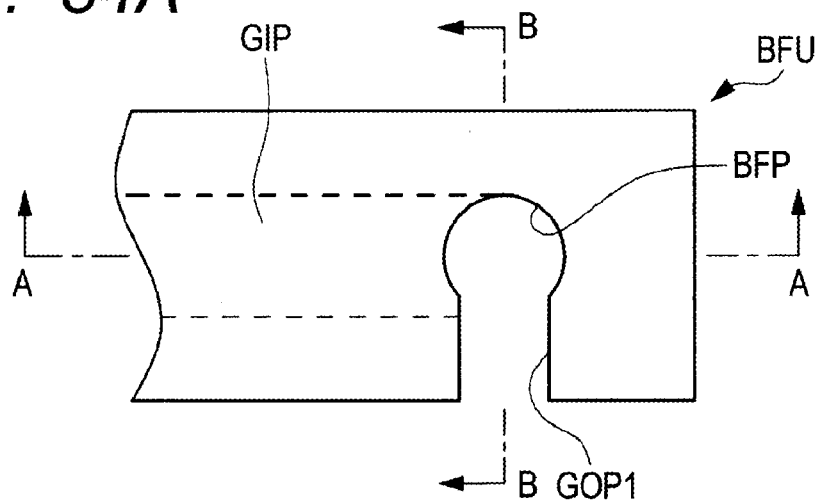
FIGS. 34($a$), 34($b$), and 34($c$) show the constitution of a ball formation unit in Modification Example 2, in which FIG. 34($a$) is a plan view showing a portion of the ball formation unit in Modification Example 2, FIG. 34($b$) is a cross-sectional view taken along the line A-A in FIG. 34(a)
FIG. 34(c) is a cross-sectional view taken along the line B-B in FIG. 34(a)
Figure 34B:
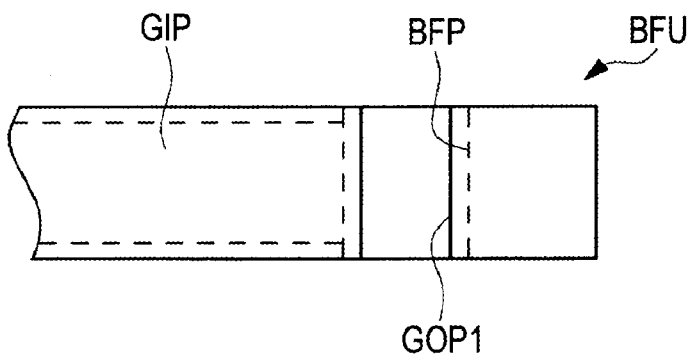
Figure 34C:
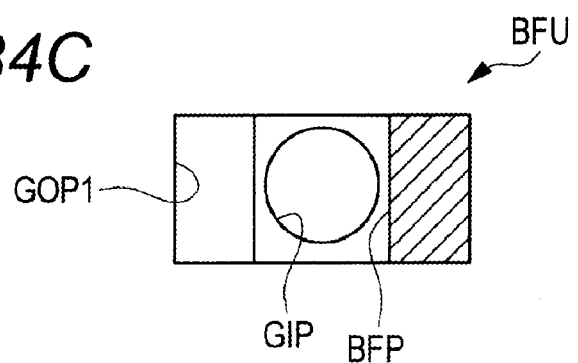

A description will next be made on the constitution example of the gas outlet portion GOP having a cross-sectional area within the above-described range. FIGS. 34(a), 34(b), and 34(c) show the constitution of a ball formation unit in Modification Example 2, in which FIG. 34(a) is a plan view showing a portion of the ball formation unit in Modification Example 2 and FIG. 34(b) is a cross-sectional view taken along the line A-A in FIG. 34(a). FIG. 34(c) is a cross-sectional view taken along the line B-B in FIG. 34(a).

As shown in FIG. 34(a) to FIG. 34(c), a gas outlet portion GOP 1 of Modification Example 2 penetrates through the ball formation unit BFU in the thickness direction thereof. The cross-sectional area of the gas outlet portion GOP1 shown in FIG. 34 reaches maximum (100%) so that the antioxidant can be discharged efficiently from the gas outlet portion GOP1.

Figure 35A:
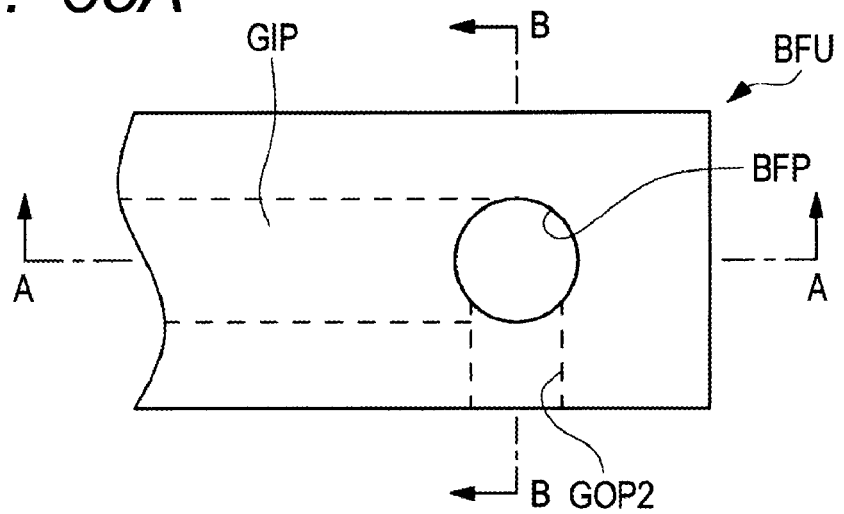
Figure 35B:
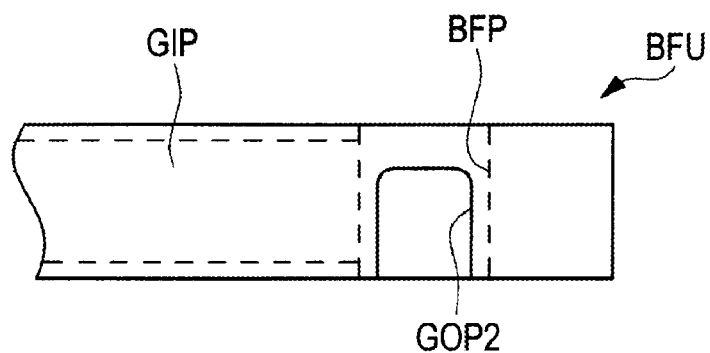
Figure 35C:
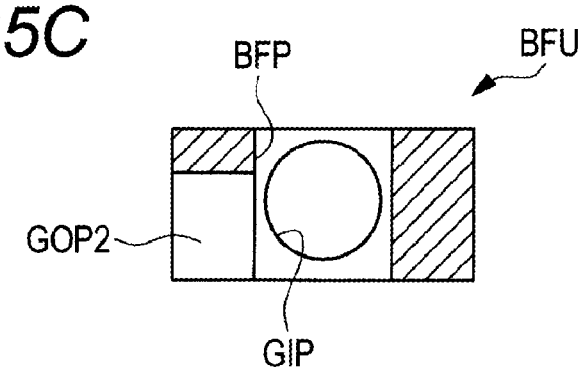

FIGS. 35(a), 35(b), and 35(c) show the constitution of another ball formation unit in Modification Example 2, in which FIG. 35(a) is a plan view showing a portion of the another ball formation unit in Modification Example 2 and FIG. 35(b) is a cross-sectional view taken along the line A-A in FIG. 35(a). FIG. 35(c) is a cross-sectional view taken along the line B-B in FIG. 35(a).

As shown in FIG. 35(a) to FIG. 35(c), a gas outlet portion GOP2 in this Modification Example 2 does not penetrate through the ball formation unit BFU in the thickness direction thereof, but as shown in FIG. 35(b), the ball formation unit BFU has an opening portion extending from the bottom surface side to the vicinity of the top surface. More specifically, the cross-sectional area of the gas outlet portion GOP2 shown in FIG. 35 is 75% of the maximum cross-sectional area. The ball formation unit of this modification example can discharge the antioxidant gas sufficiently from the gas outlet portion GOP2, though not so much as in FIG. 34.

Figure 36A:
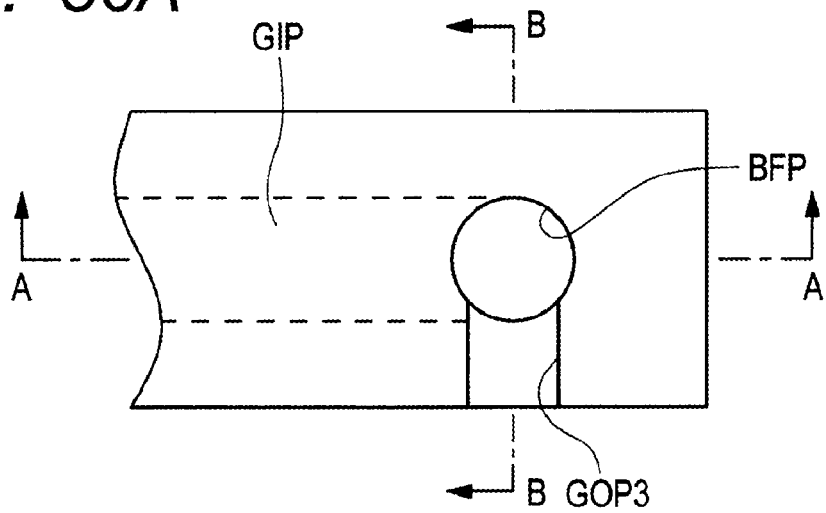
Figure 36B:
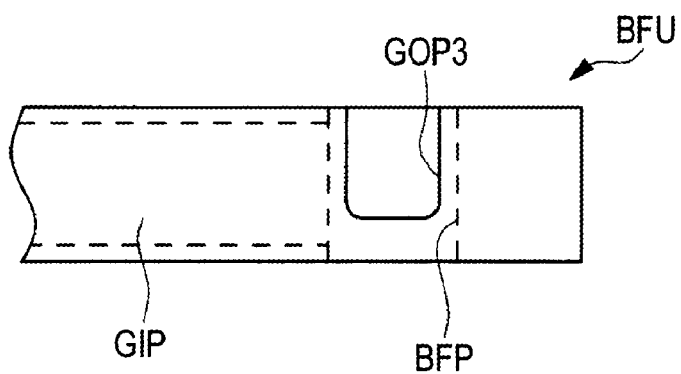
Figure 36C:
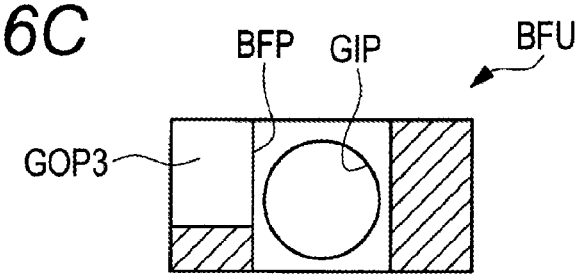

FIGS. 36(a), 36(b), and 36(c) show the constitution of a further ball formation unit in Modification Example 2, in which FIG. 36(a) is a plan view showing a portion of the further ball formation unit in this Modification Example 2 and FIG. 36(b) is a cross-sectional view taken along the line A-A in FIG. 36(a). FIG. 36(c) is a cross-sectional view taken along the line B-B in FIG. 36(a).

As shown in FIG. 36(a) to FIG. 36(c), a gas outlet portion GOP3 in this Modification Example 2 does not penetrate through the ball formation unit BFU in the thickness direction thereof. Particularly as shown in FIG. 36(b), the ball formation unit BFU has an opening portion extending from the upper surface side to the vicinity of the bottom surface. More specifically, the cross-sectional area of the gas outlet portion GOP3 shown in FIG. 36 is 75% of the maximum cross-sectional area. The ball formation unit of this modification example can discharge the antioxidant gas sufficiently from the gas outlet portion GOP3, though not so much as in FIG. 34.

<Modification Example 3 (Cross-Sectional Shape of Gas Outlet Portion)> The gas outlet portion GOP may have any cross-sectional shape insofar as it has a cross-sectional area as described in Modification Example 2. It may have, in addition to an opening shape penetrating through the ball formation unit in the thickness direction thereof, a rectangular shape, a round shape, or the like.

Figure 37A:
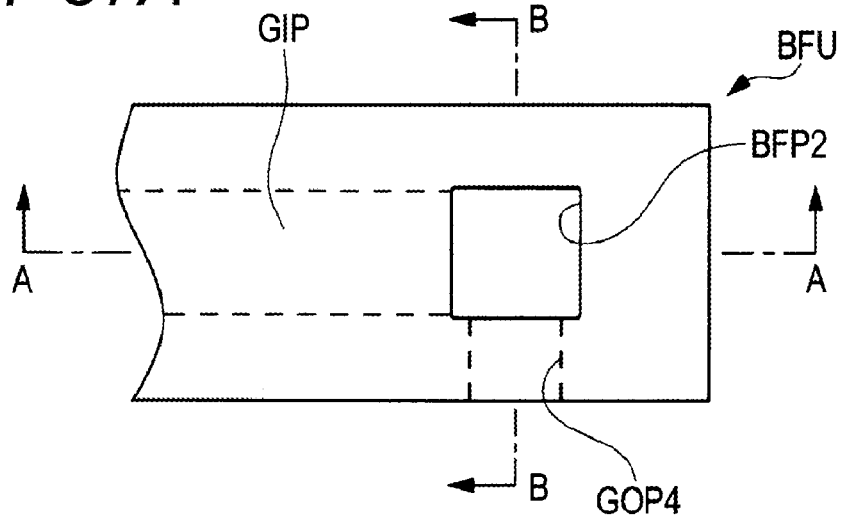
Figure 37B:
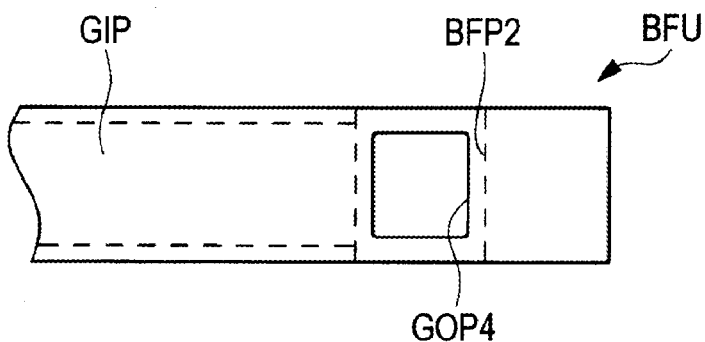
Figure 37C:
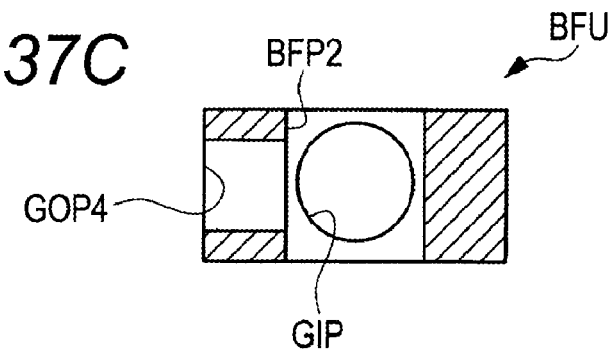

FIGS. 37(a), 37(b), and 37(c) show the constitution of a ball formation unit in Modification Example 3, in which FIG. 37(a) is a plan view showing a portion of the ball formation unit in Modification Example 3 and FIG. 37(b) is a cross-sectional view taken along the line A-A in FIG. 37(a). FIG. 37(c) is a cross-sectional view taken along the line B-B in FIG. 37(a).

As shown in FIG. 37(a) to FIG. 37(c), a gas outlet portion GOP4 in Modification Example 3 does not penetrate through the ball formation unit BFU in the thickness direction thereof. Particularly as shown in FIG. 37(b), the ball formation unit BFU has an opening portion in the vicinity of the center portion thereof. More specifically, the cross-sectional area of the gas outlet portion GOP4 shown in FIG. 37 is 50% or greater of the maximum cross-sectional area and the opening portion has a rectangular cross-sectional shape. Even in such a constitution, the antioxidant gas can be discharged sufficiently from the gas outlet portion GOP4.

Figure 38A:
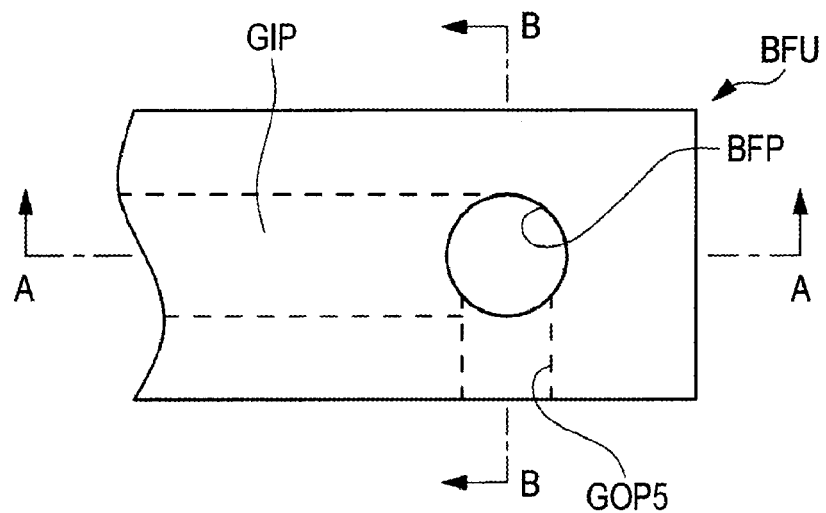
Figure 38B:
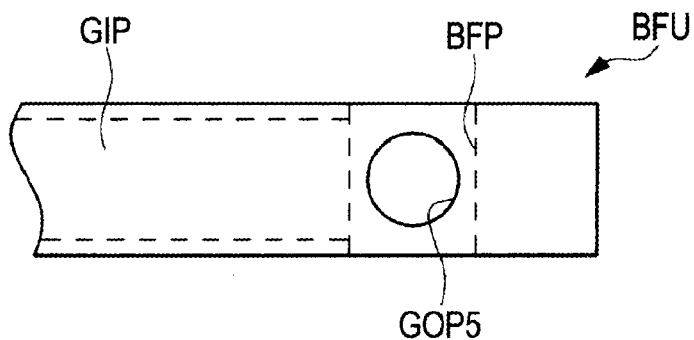
Figure 38C:
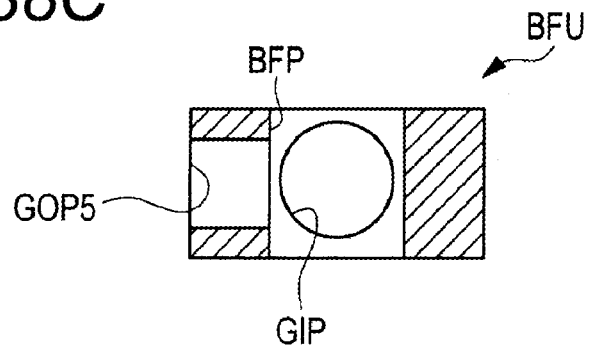

FIGS. 38(a), 38(b), and 38(c) show the constitution of another ball formation unit in Modification Example 3, in which FIG. 38(a) is a plan view showing a portion of the another ball formation unit in Modification Example 3 and FIG. 38(b) is a cross-sectional view taken along the line A-A in FIG. 38(a). FIG. 38(c) is a cross-sectional view taken along the line B-B in FIG. 38(a).

As shown in FIG. 38(a) to FIG. 38(c), a gas outlet portion GOP5 in Modification Example 3 does not penetrate through the ball formation unit BFU in the thickness direction thereof, but particularly as shown in FIG. 38(b), the ball formation unit BFU has an opening portion in the vicinity of the center portion thereof. More specifically, the cross-sectional area of the gas outlet portion GOP5 shown in FIG. 38 is 50% or greater of the maximum cross-sectional area and the opening portion has a round cross-sectional shape. Even in such a constitution, the antioxidant gas can be sufficiently discharged from the gas outlet portion GOP5.

(Second Embodiment) In the second embodiment, a description will be made on an example of providing a gas reservoir portion on the side opposite to the gas inlet portion relative to the tip portion of the capillary.

Figure 39A:
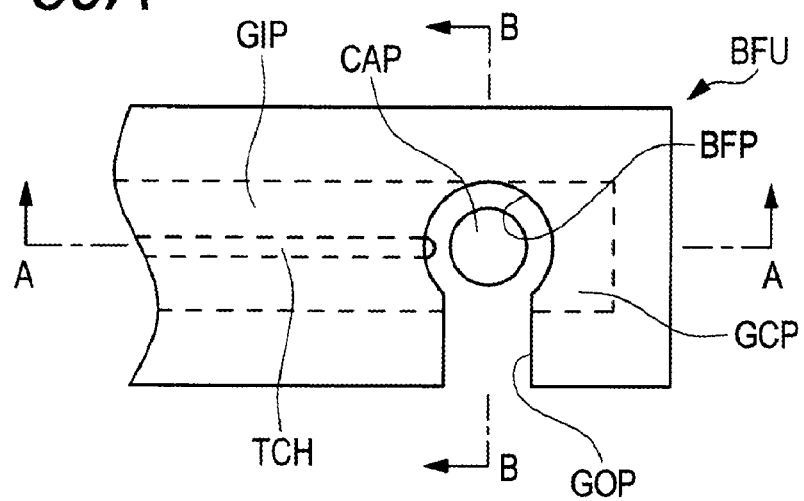
Figure 39B:
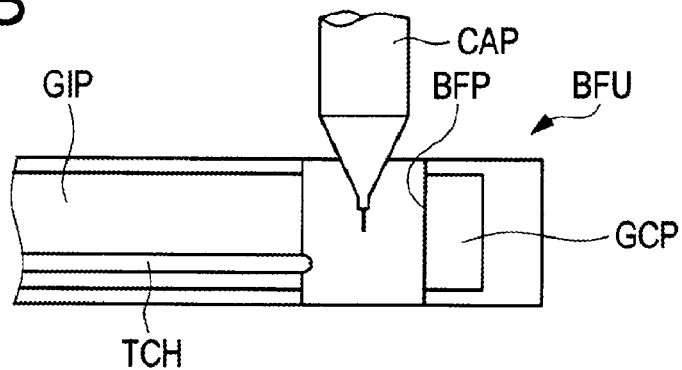
Figure 39C:
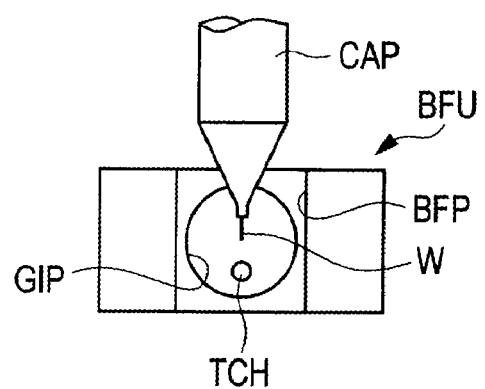

FIGS. 39(a), 39(b), and 39(c) show the constitution of a ball formation unit of the second embodiment, in which FIG. 39(a) is a plan view showing a portion of a ball formation unit in the second embodiment and FIG. 39(b) is a cross-sectional view taken along the line A-A in FIG. 39(a): FIG. 39(c) is a cross-sectional view taken along the line B-B in FIG. 39(a).

A difference between the second embodiment and the first embodiment is that the ball formation unit of the second embodiment is equipped with a gas reservoir portion GCP on the side opposite to the gas inlet portion GIP relative to the tip portion of the capillary CAP. In the ball formation unit BFU of the second embodiment having such a constitution, a turbulent flow due to collision between a gas flow supplied from the gas inlet portion GIP and a gas flow bounced back from the gas reservoir portion GCP can be reduced and at the same time, even if a turbulent flow occurs, the turbulent flow can be formed at a position farther than the position in the first embodiment. As a result, according to the second embodiment, the influence of the turbulent flow to the initial ball formed at the tip portion of the capillary CAP can be reduced, making it possible to smoothen the gas flow in the vicinity of the initial ball, thereby forming a stable initial ball.

According to the second embodiment, it is therefore possible to suppress damage to the pad in a wire bonding step using an easily oxidizable metal such as copper or solder for a wire. Described specifically, according to the second embodiment, it is possible to actualize, as an initial ball formed at the tip portion of the capillary, a normal-state initial ball, that is, a truly spherical initial ball having an appropriate ball diameter, no eccentricity, and an unoxidized surface. Damage to the pad given at the time of wire bonding due to eccentricity of the initial ball can be suppressed and as a result, a semiconductor device having improved reliability can be provided.

Figure 40A:
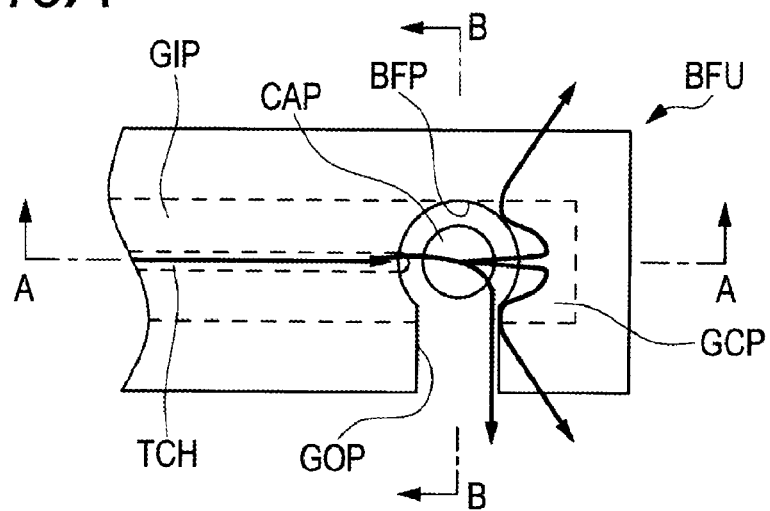
FIGS. 40(a), 40(b), and 40(c) are schematic views showing the flow of an antioxidant gas in Second Embodiment, in which FIG. 40(a), FIG. 40(b), and FIG. 40(c) correspond to FIGS. 39(a), FIG. 39(b), and FIG. 39(c), respectively.
Figure 40B:
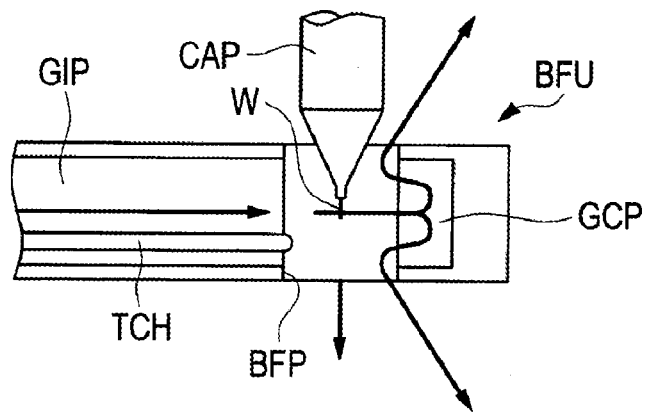
Figure 40C:
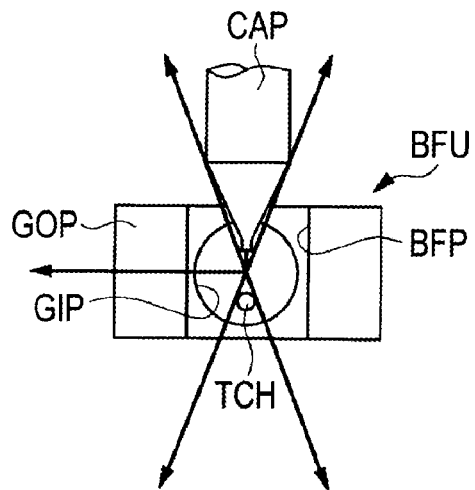

FIGS. 40(a), 40(b), and 40(c) are schematic views showing the flow of an antioxidant gas in the second embodiment, in which FIG. 40(a) to FIG. 40(c) correspond to FIG. 39(a) to FIG. 39(c), respectively. The flow of the antioxidant gas is shown by an arrow. The ball formation unit BFU of the second embodiment is, similar to that of the first embodiment, provided with a gas outlet portion GOP for discharging an antioxidant gas. This means that also in the second embodiment, as a path for discharging the antioxidant gas introduced from the gas inlet portion GIP, there exist not only a path in the vertical direction of the ball formation portion BFP penetrating through the ball formation unit BFU in the thickness direction thereof but also a gas outlet portion GOP. According to the second embodiment, a gas outlet portion GOP is added as a path for discharging the antioxidant gas so that the antioxidant gas supplied to the ball formation portion BFP can efficiently be discharged from the gas outlet portion GOP smoothly. In particular, the capillary CAP itself is not placed inside the gas outlet portion GOP and a member disturbing the discharge of the antioxidant gas is not placed so that the antioxidant gas can be discharged sufficiently from the gas outlet portion GOP.

Further, in the second embodiment, as shown in FIG. 40(a) and FIG. 40(b), a gas reservoir portion GCP is provided so that a turbulent flow due to collision between a gas flow supplied from the gas inlet portion GIP and a gas flow bounced back from the gas reservoir portion GCP can be reduced and at the same time, even if a turbulent flow occurs, the turbulent flow can be formed at a position farther than the position in the first embodiment. As a result, according to the second embodiment, the influence of the turbulent flow on the initial ball formed at the tip portion of the capillary CAP can be lessened so that the gas flow in the vicinity of the initial ball can be made more smooth and thereby, a stable initial ball can be formed.

The inventions made by the present inventors were described specifically based on some embodiments. It is needless to say, however, that the invention is not limited by these embodiments and can be changed without departing from the gist of the invention.

The MOSFET described above is not limited to that having a gate insulating film formed using an oxide film but embraces MISFET (Metal Insulator Semiconductor Field Effect Transistor) having a gate insulating film formed from various insulating films. This means that the term "MOSFET" is used herein for the convenience sake and this term "MOFET" is used herein as a term embracing MISFET.

The technical concept of the present invention relates to a wire bonding step using an easily oxidizable metal as a wire. In particular, in the embodiments described above, the description was made while using a copper wire as an example. The technical concept of the present invention is not limited to it but may be used widely in a wire bonding step using an easily oxidizable metal such as solder.

<Modification Example> In the above embodiments, a description was made with a wiring step using a copper wire as an example. The technical concept of the present invention can also be applied widely to a step of forming a stud bump electrode made of copper, because the stud bump electrode is formed by using a capillary to land, on a pad, an initial ball formed at the tip portion of the capillary, applying a compressive load and ultrasonic oscillation to deform the initial ball into a press-bonded ball, and then cutting the copper wire at the end portion of this press-bonded ball. This means that application of a compressive load and ultrasonic oscillation to form a press-bonded ball is common to both the wire bonding step using a copper wire and the stud bump electrode formation step, so that the problem of damage to the pad also occurs even in the step of forming a stud bump electrode made of copper. The damage to the pad can therefore be prevented effectively by applying the technical concept of the invention to the step of forming the stud bump electrode.

Figure 41:
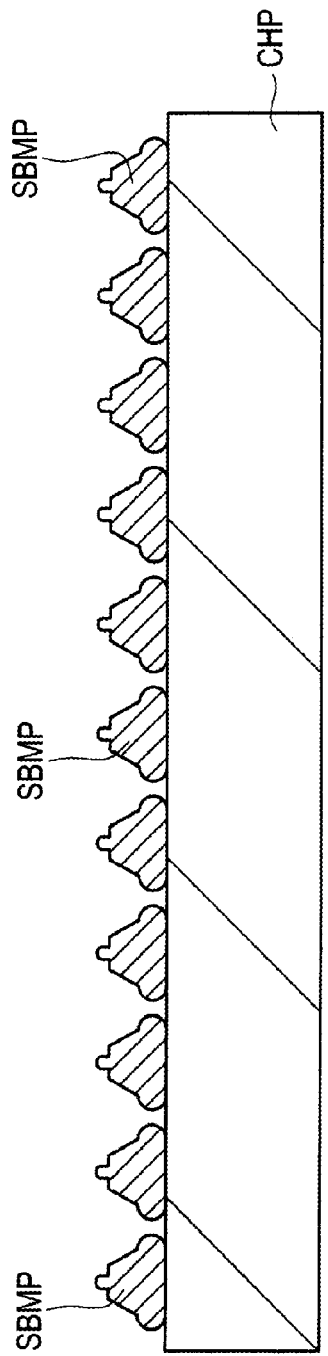
FIG. 41 is a view showing a plurality of stud bump electrodes formed on a semiconductor chip.

A constitution example of a stud bump electrode will next be described. FIG. 41 shows a plurality of stud bump electrodes SBMP formed on a semiconductor chip CHP. Although not shown in FIG. 41, the stud bump electrodes SBMP are placed on a pad formed on the surface of the semiconductor chip CHP. The semiconductor chip CHP having thereon the stud bump electrodes SBMP is mounted on a wiring substrate, for example, by face-down bonding.

Figure 42:
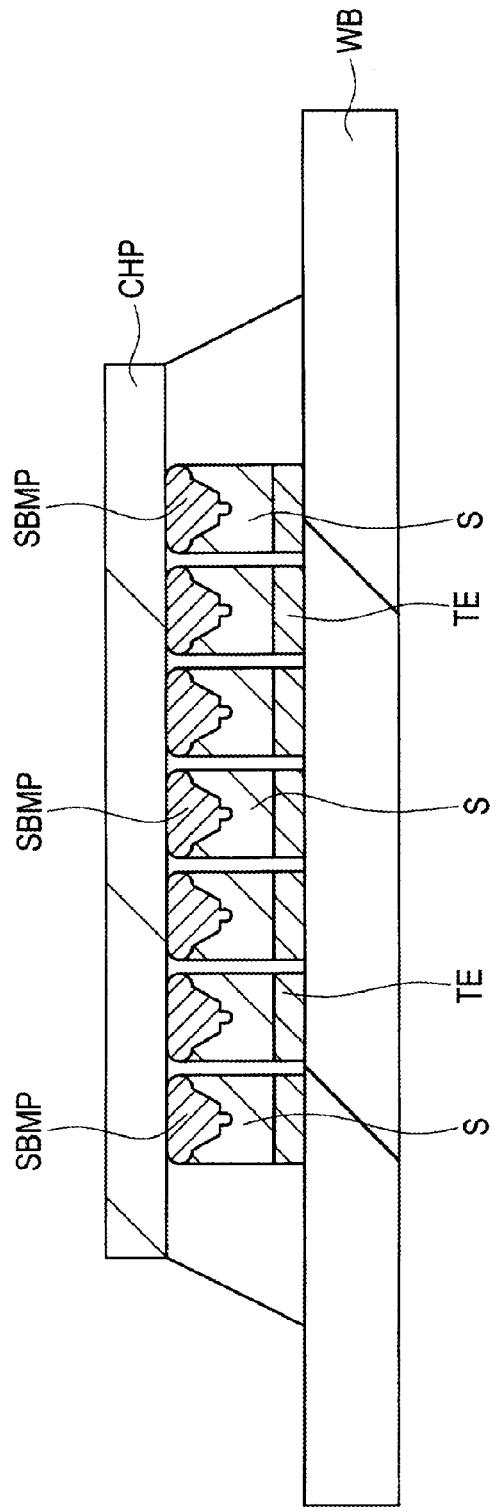
FIG. 42 shows an example of mounting a semiconductor chip having stud bump electrodes formed thereon on a wiring substrate.

FIG. 42 shows an example of mounting a semiconductor chip CHP having stud bump electrodes SBMP formed thereon on a wiring substrate WB. As shown in FIG. 42, the wiring substrate WB has thereon terminals TE and these terminals TE and the stud bump electrodes SBMP mounted on the semiconductor chip CHP are placed so as to face with each other. The stud bump electrodes SBMP mounted on the semiconductor chip CHP and the terminals TE formed on the wiring substrate WB are coupled to each other, for example, with a solder S. Thus, the semiconductor chip CHP having stud bump electrodes thereon can be mounted on the wiring substrate WB.

The invention can be used widely in the industries manufacturing semiconductor devices.

What is claimed is:

1. A method of manufacturing a semiconductor device comprising:
(a) preparing a wiring board over which a semiconductor chip is mounted; and
(b) electrically connecting a conductive wire to the semiconductor chip, wherein the step (b) includes:
(b1) preparing a ball formation unit having a top surface and a bottom surface opposite the top surface, and including a ball formation portion, a gas inlet portion for introducing an antioxidant gas into the ball formation portion, a gas outlet portion for discharging the antioxidant gas from the ball formation portion, and a torch electrode for discharging electricity to the conductive wire in the ball formation portion;

(b2) disposing a tip portion of a capillary in the ball formation portion in a state where a tip portion of the conductive wire projects from the tip portion of a capillary;

(b3) forming an initial ball at the tip portion of the conductive wire by discharging electricity to the tip portion of the conductive wire from the torch electrode in a state where the antioxidant gas is filled in the ball formation portion by introducing the antioxidant gas from the gas inlet portion, passing the antioxidant gas from the gas inlet portion in a first direction in a top surface view, and discharging the antioxidant gas from the gas outlet portion in a second direction different from the first direction in the top surface view, and (b4) bonding the initial ball of the conductive wire to an electrode pad of the semiconductor chip.

2. The method of manufacturing a semiconductor device according to claim 1, wherein the gas outlet portion is disposed within a range of 90°±45° relative to the first direction in the ball formation unit.

3. The method of manufacturing a semiconductor device according to claim 2, wherein the gas outlet portion is disposed within a range of 90° relative to the first direction in the ball formation unit.

4. The method of manufacturing a semiconductor device according to claim 1, wherein the ball formation portion penetrates the top surface to the bottom surface of the ball formation unit, and wherein, in the step (b2), the tip portion of the capillary is disposed in the ball formation portion by inserting the capillary from a top surface side.

5. The method of manufacturing a semiconductor device according to claim 4, wherein the gas outlet portion penetrates the top surface to the bottom surface of the ball formation unit.

6. The method of manufacturing a semiconductor device according to claim 5, wherein, in the first direction, a width of the gas outlet portion is equal to or greater than a width of the capillary.

7. The method of manufacturing a semiconductor device according to claim 6, wherein, in the first direction, the width of the gas outlet portion is equal to or less than a width of the ball formation portion.

8. The method of manufacturing a semiconductor device according to claim 6, wherein the ball formation unit includes a gas reservoir portion for keeping a part of the antioxidant gas, and wherein the gas reservoir portion is disposed in the ball formation portion such that the gas reservoir portion faces towards the gas inlet portion in the first direction in the top surface view.

9. The method of manufacturing a semiconductor device according to claim 1, wherein the conductive wire is a metal wire more oxidizable than a gold wire.

10. The method of manufacturing a semiconductor device according to claim 9, wherein the conductive wire is a copper wire.

11. The method of manufacturing a semiconductor device according to claim 1, wherein the antioxidant gas is an inert gas.

12. The method of manufacturing a semiconductor device according to claim 11, wherein the inert gas contains a nitrogen gas or an argon gas.

13. The method of manufacturing a semiconductor device according to claim 1, wherein the inert gas is a forming gas containing an inert gas and a reducing gas.

14. The method of manufacturing a semiconductor device according to claim 13, wherein the forming gas contains a nitrogen gas and a hydrogen gas.

15. The method of manufacturing a semiconductor device according to claim 1, further comprising:

(c) after the step (b), electrically connecting the conductive wire to a terminal of the wiring board, and (d) after the step (c), sealing the semiconductor chip and the conductive wire, and a portion of the wiring board by a sealing resin.

16. The method of manufacturing a semiconductor device according to claim 15, wherein the wiring board is a wiring substrate and the terminal of the wiring board is a land terminal.

17. The method of manufacturing a semiconductor device according to claim 15, wherein the wiring board is a lead frame and the terminal of the wiring board is a lead.

* * * * *